(12) United States Patent
Wallace et al.

(10) Patent No.: US 7,571,363 B2
(45) Date of Patent: Aug. 4, 2009

(54) PARAMETRIC MEASUREMENT OF HIGH-SPEED I/O SYSTEMS

(75) Inventors: Hugh S. Wallace, Fort Collins, CO (US); Adrian Wan-Chew Seet, New York, NY (US); Klaus-Dieter Hilliges, Shanghai (CN)

(73) Assignee: Agilent Technologies, Inc., Santa Clara, CA (US)

( * ) Notice: Subject to any disclaimer, the term of this patent is extended or adjusted under 35 U.S.C. 154(b) by 333 days.

(21) Appl. No.: 11/419,003

(22) Filed: May 18, 2006

(65) Prior Publication Data

US 2007/0268963 A1 Nov. 22, 2007

(51) Int. Cl.
*G01R 31/28* (2006.01)
(52) U.S. Cl. .............. 714/724; 714/25; 714/30; 714/56; 714/709; 714/712; 714/716; 714/738; 714/744; 327/141; 370/395.62; 375/221; 375/215; 375/213; 375/226; 375/229; 375/371; 375/376
(58) Field of Classification Search ................ None
See application file for complete search history.

(56) References Cited

U.S. PATENT DOCUMENTS

| | | | |
|---|---|---|---|
| 6,421,801 B1 * | 7/2002 | Maddux et al. ............. 714/744 |
| 6,538,475 B1 * | 3/2003 | Johansen et al. ............. 327/12 |
| 6,760,551 B2 * | 7/2004 | Seet et al. ................... 398/202 |
| 6,977,960 B2 * | 12/2005 | Takinosawa ................ 375/224 |
| 7,016,613 B2 * | 3/2006 | Savoj ......................... 398/155 |
| 7,092,474 B2 * | 8/2006 | Cao ............................ 375/375 |
| 7,127,645 B2 * | 10/2006 | Toyoda et al. ............... 714/700 |
| 7,151,379 B2 * | 12/2006 | Christensen ................ 324/620 |
| 7,317,775 B1 * | 1/2008 | Erhart et al. ................ 375/355 |
| 7,349,506 B2 * | 3/2008 | Shizuki ....................... 375/350 |
| 2003/0093730 A1 * | 5/2003 | Halder et al. ............... 714/724 |
| 2004/0263225 A1 * | 12/2004 | Perrott et al. ............... 327/156 |
| 2005/0243950 A1 * | 11/2005 | Laquai et al. ............... 375/326 |
| 2007/0113119 A1 * | 5/2007 | Hafed et al. ................ 714/700 |
| 2007/0237277 A1 * | 10/2007 | Unterricker ................. 375/375 |

OTHER PUBLICATIONS

PCT International Search Report dated Oct. 30, 2006.

\* cited by examiner

*Primary Examiner*—John P Trimmings
(74) *Attorney, Agent, or Firm*—Ian Hardcastle

(57) ABSTRACT

A phase comparator is used to test a device under test comprising an input/output (I/O) circuit by applying a signal to the device under test; extracting a phase signal from the phase comparator; and determining parametric information pertaining to the I/O circuit of the device under test from the phase signal.

42 Claims, 8 Drawing Sheets

PARAMETRIC MEASUREMENT OF HIGH-SPEED I/O SYSTEMS

RELATED APPLICATIONS

This application claims priority under 35 USC §119(e) of United States provisional patent application No. 60/683,105, incorporated by reference.

BACKGROUND

As electronic devices, typically integrated circuits, become faster, more complex, and of denser design, testing such devices during manufacture to eliminate defective devices has become more important. Such testing is needed to ensure that the product in which the electronic devices are used performs in accordance with its performance specifications. As used in this disclosure, the term manufacturing encompasses manufacturing the electronic devices themselves and manufacturing sub-assemblies, such as printed circuit boards, and products in which the electronic devices are used. Notwithstanding their increased performance and capability, the average selling price of electronic devices has steadily declined over the years. This has driven a relentless effort by manufacturers to reduce manufacturing costs. The effort has been highly successful in producing a steep decline in device fabrication costs. However, conventional testing techniques require time, equipment, and personnel resources whose costs have not declined as steeply as device fabrication costs. As a result, the cost of testing has come to represent an increasing fraction of the overall manufacturing cost. Additionally, in-service testing of products in which electronic devices are used is increasingly being used to ensure that the performance of the product is maintained throughout its service life.

High-speed digital input-output systems comprising I/O circuits are critical components of many electronic devices used in such applications as telecommunications and information processing. As used in this disclosure, the term I/O circuit will be taken to refer to either or both of a transmitter circuit and a receiver circuit. Although I/O circuits transmit or receive signals representing digital data, the behavior of such circuits is essentially that of an analog circuit. This is especially so as the data rate at which the I/O circuit transmits or receives increases. Effective testing of high-speed I/O circuits therefore increasingly relies on determining analog parameters.

The proper operation of an I/O circuit to transmit or receive signals representing digital data depends not only on the operation of the I/O circuit itself, but additionally on the properties of the transmission line or lines and connectors connected to the I/O circuit. Thus, parametric performance measurements of I/O circuits often must take account of phenomena such as parasitic capacitance, heat effects, electromagnetic interference, signal reflection and loss-induced distortion.

A current trend is to try to reduce the cost of testing complex electronic devices by including test circuits on the same chip. However, testing the I/O circuits of complex electronic devices using conventional on-chip test techniques often requires that analog-to-digital (A/D) converters or other sensitive analog circuits be located on the chip. Such on-chip testing circuits are often problematic in that they typically occupy too much die area and consume too much power. Moreover, it is often difficult and expensive to provide such on-chip testing circuits with sufficient speed to allow them to check the dynamic performance of the I/O circuits. Incorporating on-chip testing circuits capable of effectively testing I/O circuits adds additional expense and complexity. An I/O circuit testing technique that occupies relatively little die area, that has low power consumption and that is capable of effectively testing analog performance parameters is desirable.

Current testing of I/O circuits typically focuses only transmitter circuits, and typically does not test receiver circuits. This is because many receiver circuits do not provide any practical test access for measuring the signal output by the receiver circuit. Accordingly, what is additionally needed is an effective way to test receiver circuits.

DETAILED DESCRIPTION

Figure 1:
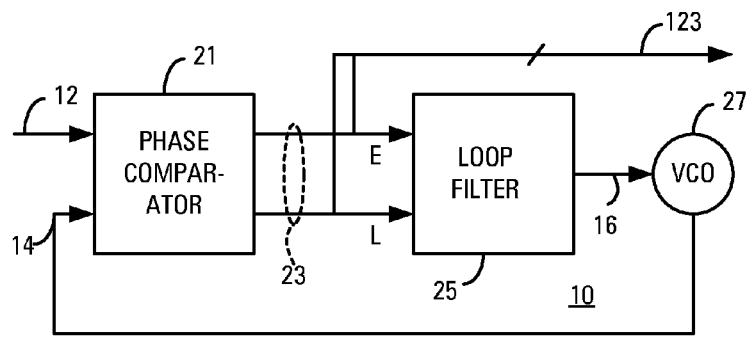
FIG. 1 is a block diagram showing an example of a phase tracking from which a phase signal is extracted in accordance with embodiments of the invention.

Many types of electronic device incorporate one or more digital input-output (I/O) circuits. An I/O circuit is either or both of a receiver circuit and a transmitter circuit. A receiver circuit is a circuit that receives an input signal from a transmission medium. The input signal represents digital data and is typically, but not necessarily, a differential signal. The receiver circuit extracts the digital data from the input signal and provides a digital data signal suitable for local use. A transmitter circuit is a circuit that receives a digital data signal and derives from the digital data signal an output signal suitable for transmission via a transmission medium. The output signal represents the digital data and is typically, but not necessarily, a differential signal.

As the operational speed of the digital I/O circuit increases, the digital I/O circuit increasingly exhibits analog behaviors. This is the result of the properties of the I/O circuit itself and additionally the result of the effects on the properties of the I/O circuit of the transmission medium, parasitic capacitance, signal reflection, and other phenomena relating to the operating environment. For the purposes of this disclosure, a digital I/O circuit that exhibits analog behaviors will be referred to a high-speed I/O circuit. High-speed I/O circuits typically operate at data rates of 1 gigabit/second (1 Gb/s) and higher. However, the techniques disclosed in this disclosure may additionally be used to make precision measurements on I/O circuits that operate at data rates below 1 GB/s.

Embodiments of the invention provide a test system and test method for testing the high-speed I/O circuit(s) of electronic devices during manufacture of the electronic devices themselves, e.g., during semiconductor device manufacture and printed circuit board manufacture, and during manufacture of a product or a sub-assembly incorporating the electronic device. Additionally, a test system or a test method in accordance with embodiments of the invention can be used during normal, in-service operation of a product incorporating a high-speed I/O circuit to determine whether the I/O circuit continues to comply with its performance specifications. Finally, a test system or a test method in accordance with embodiments of the invention can be used during the design of an electronic device incorporating a high-speed I/O circuit.

As used in this disclosure, the term device under test refers to an electronic device that comprises a high-speed I/O circuit and that is subject to testing using a test method or a test system in accordance with an embodiment of the invention. The term device under test additionally refers to a sub-assembly, an end product or a system that comprises such a high-speed I/O circuit and that is subject to testing using a test method or a test system in accordance with an embodiment of the invention.

A receiver circuit is typically composed of a differential input circuit, a clock and data recovery (CDR) circuit, and a sampling circuit. The CDR circuit is an example of a phase tracking circuit. The input circuit has a differential input that receives the differential input signal from the transmission medium. The CDR circuit is connected to the output of the differential input circuit and recovers the clock signal from the signal at the output of the differential input circuit. The sampling circuit is also connected to the output of the differential input circuit and additionally receives the clock signal recovered by the CDR circuit. The sampling circuit operates in response to the recovered clock signal and the signal output by the differential input circuit to re-generate the digital data represented by the differential input signal.

A typical phase tracking circuit such as a CDR circuit is based on a phase-lock loop circuit (PLL). Phase tracking circuits may alternatively be based on a delay-lock loop. A delay-lock loop-based phase tracking circuit operates similarly to a phase-lock loop-based phase tracking circuit, so the term phase-lock loop as used in this disclosure will be taken to cover a delay-lock loop as well as a phase-lock loop.

FIG. 1 is a block diagram showing an example of a phase-lock loop 10 that constitutes part of typical PLL-based phase tracking circuit, namely, a PLL-based CDR circuit. The PLL-based CDR circuit constitutes part of a typical device under test capable of being tested by a test method and a test system in accordance with an embodiment of the invention. PLL 10 is composed of a phase comparator 21, a loop filter 25 and a VCO 27 connected in series. One input of phase comparator 21 is connected to receive an input signal 12, the other input is connected to receive a VCO output signal 14 from the output of VCO 27. In a typical receiver circuit incorporating a CDR circuit, input signal 12 is the signal output by the above-mentioned differential input circuit (not shown). Phase comparator 21 generates a phase signal 23. In an embodiment in which PLL 10 is a digital PLL, as in the example shown, phase signal 23 comprises two digital components E and L. Digital component E in a given state, e.g., a logical 1 state, indicates that the phase of input signal 12 leads that of VCO output signal 14. Digital component L in a given state, e.g., a logical 1 state, indicates that the phase of input signal 12 lags that of VCO output signal 14. The other states, e.g., logical 0 states, of digital components E and L indicate that input signal 12 is in phase with VCO output signal 14.

In a conventional PLL-based phase tracking circuit such as a CDR circuit, phase signal 23 is used exclusively within the PLL. Phase comparator 21 feeds phase signal 23 exclusively to loop filter 25. Loop filter 25 filters the phase signal to generate a VCO control signal 16 and provides VCO control signal 16 to the control input of VCO 27. VCO control signal 16 controls the frequency of VCO output signal 14 in a manner that tends to reduce the phase difference between VCO output signal 14 and input signal 12 to zero.

In accordance with embodiments of the invention, phase tracking circuit 10 differs from a conventional phase tracking circuit in that phase comparator 21 outputs phase signal 23 to a circuit outside phase tracking circuit 10 as a phase signal 123. The receiver circuit of which phase tracking circuit 10 forms part receives an input signal and phase comparator 21 outputs phase signal 123 in response to the input signal. The phase signal is sampled to generate bit-level data. The sampling continues until a sufficient data set of bit-level data has been obtained. The data set is then analyzed to determine parametric information pertaining to the I/O circuit of the device under test.

In a minimalist modification of a conventional phase tracking circuit such as a CDR circuit, traces are provided that connect the E and L component outputs of phase comparator 21 to one or more additional pins on the device package (not shown) of the electronic device of which the phase tracking circuit forms part. Additionally or alternatively, the traces may extend to a processing circuit (not shown) that forms part of the electronic device of which the phase tracking circuit additionally forms part. These possibilities will be described in more detail below. A more typical modification includes the addition of a buffer circuit (not shown) in the path between the E and L component outputs of phase comparator 21 and the additional package pins or the processing circuit. The buffer circuit receives the phase signal components E and L from phase comparator 21 and provides buffered phase signal components E and L to the additional package pins or to the processing circuit as phase signal 123. The buffer circuit minimizes the effect of additionally outputting phase signal 123 on the normal operation of phase tracking circuit 10.

In an embodiment in which phase tracking circuit 10 is an analog phase tracking circuit, phase comparator 21 generates phase signal 23 as a single analog phase signal indicative of the phase difference between input signal 12 and VCO output signal 14. In such embodiment, the phase comparator additionally outputs analog phase signal 23 to a decision circuit (not shown) that converts the analog phase signal into a digital phase signal 123 having E and L components, as described above. The decision circuit additionally minimizes the effect of additionally outputting the phase signal on the normal operation of phase tracking circuit 10. The decision circuit typically constitutes part of the on-chip test circuitry of the device under test of which analog phase tracking circuit 10 forms part. In this case, the device under test outputs digital phase signal 123 having digital phase signal components E and L generated by the decision circuit. Alternatively, the decision circuit can be external to the device under test. In this case, the device under test additionally outputs the analog phase signal generated by the phase comparator of the analog phase tracking circuit to the external decision circuit. The phase tracking circuit within the device under test can output the analog phase signal either directly or, more typically, via an analog buffer circuit.

As noted above, the I/O circuit with respect to which the test method or test system in accordance with embodiments of the invention determines parametric information can comprise the receiver circuit that comprises the phase comparator that generates the phase signal. Alternatively, the I/O circuit to which the parametric information pertains can comprise any transmitter circuit that provides the signal received by the receiver circuit that comprises the phase comparator that generates the phase signal. In instances in which the I/O circuit comprises a transmitter circuit, the parametric information pertaining to the transmitter circuit can be determined from the phase signal generated by the phase comparator of the receiver circuit that, together with the transmitter circuit, constitutes at least part of the I/O circuit. Alternatively, the transmitter circuit can be tested using the phase signal generated by the phase comparator of another receiver circuit, such as that of a receiver circuit external to the device under test.

In a first example, the I/O circuit of the device under test comprises the receiver circuit and the signal received by the receiver circuit is generated by a signal generator external to the device under test. In this case, the parametric information determined from the phase signal pertains to the receiver circuit of the device under test. The signal generator is typically external to the device under test.

In a second example, the I/O circuit of the device under test comprises a receiver circuit and a transmitter circuit. The signal received by the device under test is a bit sequence received at the input of the transmitter circuit. The output of the transmitter circuit is connected to the input of the receiver circuit. In this case, the parametric information determined from the phase signal extracted from the receiver circuit pertains to both the transmitter circuit and the receiver circuit of the device under test.

In a third example, the I/O circuit of the device under test comprises a transmitter circuit, and the receiver circuit that comprises the phase comparator that generates the phase signal is external to the device under test. Parametric information for the external receiver circuit is known. The signal received by the device under test is a bit sequence received at the input of the transmitter circuit. The output of the transmitter circuit is connected to the input of the external receiver circuit. In this case, the parametric information determined from the phase signal extracted from the external receiver circuit pertains to a combination of the transmitter circuit of the device under test and the external receiver circuit. Since the parametric information of the external receiver circuit is known, parametric information pertaining to the transmitter circuit of the device under test can be determined.

In a fourth example, the I/O circuit of the device under test comprises a receiver circuit and the device under test is tested in service. The signal received by the receiver circuit is the in-service signal that the receiver circuit receives and processes in the course of its in-service operation. In this case, the parametric information determined from the phase signal extracted from the receiver circuit pertains to the receiver circuit itself. No special test signal need be provided to the device under test, and the device under test can continue to operate normally while being tested.

In addition to being used to determine parametric data pertaining to the I/O circuit of a device under test, the parametric information generated as described above can additionally be used to determine the tolerance of a receiver circuit to non-ideal input waveforms, such as those caused by a non-ideal transmission medium, and non-ideal dynamic performance of the transmitter circuit. The parametric information can also be used to determine the tolerance of a transmitter circuit to a non-ideal transmission medium and to non-ideal dynamic performance of the receiver circuit. Another use of the parametric information is to optimize the characteristics of an equalizer located ahead of the receiver circuit to compensate for the signal received at the receiver having a non-ideal waveform.

Figure 2A:
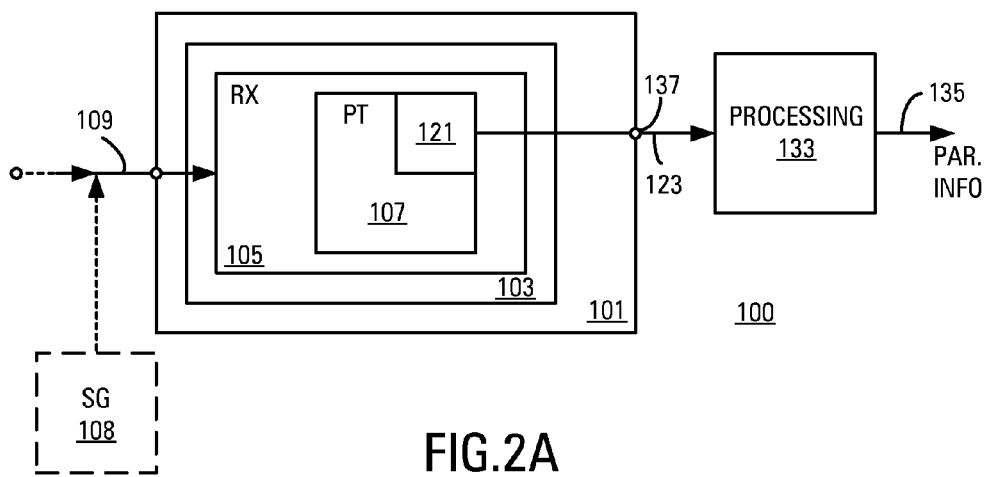
FIG. 2A is a block diagram showing a first example a test system in accordance with a first embodiment of the invention.
Figure 2B:
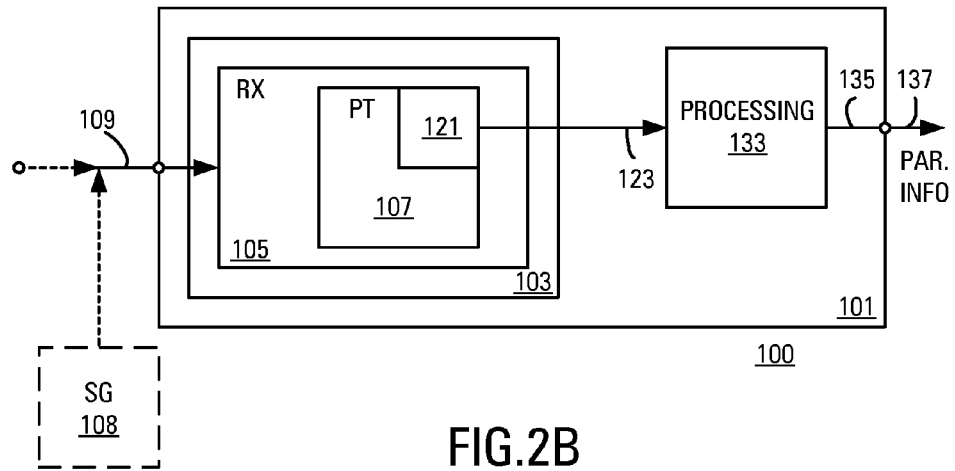
FIG. 2B is a block diagram showing a second example a test system in accordance with the first embodiment of the invention.
Figure 2C:
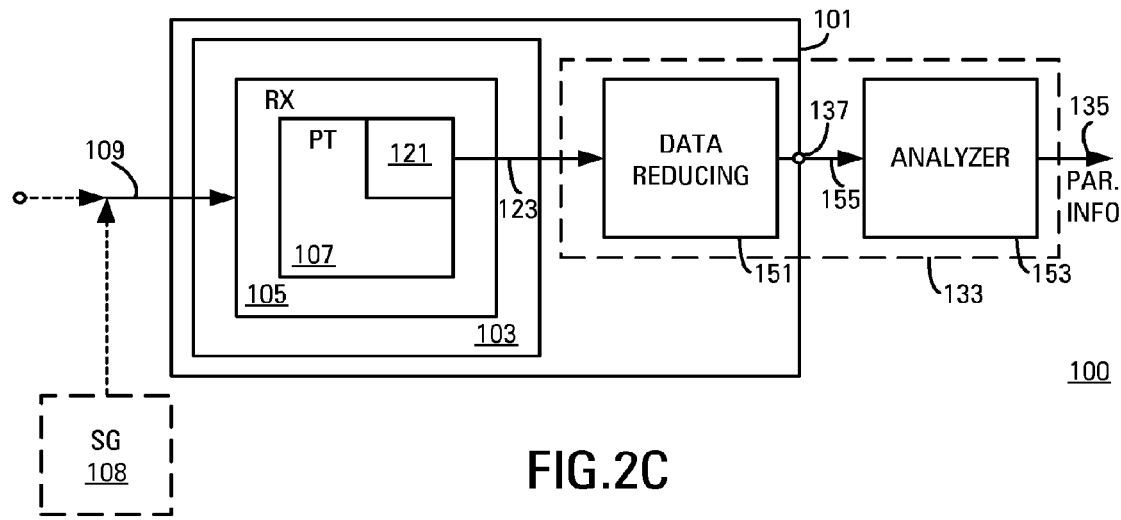
FIG. 2C is a block diagram showing a third example a test system in accordance with the first embodiment of the invention.

FIG. 2A, FIG. 2B and FIG. 2C are block diagram showing respective examples of a test system 100 in accordance with a first embodiment of the invention. Test system 100 is configured to test a device under test 101 having an I/O circuit 103 that comprises a receiver circuit 105. Test system 100 generates parametric information pertaining to receiver circuit 105. Receiver circuit 105 comprises a phase tracking circuit 107 similar in structure to above-described phase tracking circuit 10. As noted above, phase tracking circuit 107 is typically embodied as a clock and data recovery (CDR) circuit, although receiver circuit 105 may alternatively incorporate another type of phase tracking circuit. Phase tracking circuit 107 comprises a phase comparator 121. Phase comparator 121 differs from a conventional phase comparator in that it additionally outputs phase signal 123 to a circuit external to phase tracking circuit 107.

Test system 100 additionally comprises a processing circuit 133. Processing circuit 133 has an input connected to receive phase signal 123 from phase comparator 121.

Test system 100 provides a signal 109 to device under test 101. Each of the examples of test system 100 shown in FIGS. 2A, 2B and 2C additionally comprises a signal generator 108 having its output connected to the input of receiver circuit 105. Thus, in the examples shown, signal 109 generated by signal generator 108 is received at device under test 101, specifically at the input of receiver circuit 105. The connection between signal generator 108 and the input of receiver circuit 105 is typically provided by one or more pins of the package (not shown) of device under test 101. In another example, signal 109 is provided by a signal source (not shown) external to test system 100. In this case, signal generator 108 need not be present in test system 100.

In the example shown in FIG. 2A, processing circuit 133 is external to device under test 101. Phase signal 123 output by phase comparator 121 is typically connected to the input of processing circuit 133 via one or more of the pins of the package (not shown) of device under test 101. In the example shown, the package of device under test 101 has a test access port 137 that provides the connection between phase comparator 121 and the external processing circuit 133.

Referring additionally to FIG. 1, in device under test 101, receiver circuit 105 receives signal 109 and, in receiver circuit 105, phase comparator 121 in phase tracking circuit 107 generates phase signal 123 in response to signal 109. In test system 100, processing circuit 133 receives phase signal 123 from phase comparator 121 that constitutes part of phase tracking circuit 107. In the example shown, phase signal 123 comprises bit-level phase data resulting from the phase comparator 121 comparing signal 109 received by phase tracking circuit 107 to VCO output signal 14 output by VCO 27. Phase comparator 121 feeds phase signal 123 to processing circuit 133. Processing circuit 133 processes phase signal 123 received from phase comparator 121 to determine parametric information 135 pertaining the I/O circuit 103 of device under test 101. In the examples shown in FIGS. 2A, 2B and 2C, parametric information 135 relates to the receiver circuit 105 of device under test 101. In the example shown in FIG. 2A, phase signal 123 is fed off-chip to processing circuit 133.

In the example of test system 100 shown in FIG. 2B, processing circuit 133 is internal to device under test 101. A signal path that conveys phase signal 123 extends internally within device under test 101 from phase comparator 121 to the input of processing circuit 133.

In the example of test system 100 shown in FIG. 2B, phase signal 123 is fed internally within device under test 101 from phase comparator 121 to processing circuit 133. Processing circuit 133 processes phase signal 123 generated by phase comparator 121 to determine parametric information 135 pertaining to the I/O circuit 103 of device under test 101. Processing circuit 133 outputs parametric information 135 from device under test 101 to a recipient (not shown) external to device under test 101. For example, the parametric information 135 may be output to other devices, computers, or output components (not shown) constituting part of test system 100. Typically, one or more pins of the package (not shown) of device under test 101 provide the connection between the output of processing circuit 133 and the off-chip recipient (not shown) of parametric information 135. In the example shown, the package (not shown) of device under test 101 has a test access port 137 that provides the connection for parametric information 135.

In test systems in accordance with embodiments of the invention in which the device under test includes an I/O circuit that transmits and/or receives at a high data rate, phase signal 123 represents a prodigious amount of data, i.e., at least one bit per clock cycle. In the example shown in FIG. 2A, it can be difficult, expensive, or both to transmit such a large quantity of data at such a high data rate from device under test 101 to the embodiment of processing circuit 133 external to device under test 101. Moreover, in the example shown in FIG. 2B, it can be difficult, expensive, or both to store and then process such a large quantity of data in the embodiment of processing circuit 133 internal to device under test 101.

In the example of test system 100 shown in FIG. 2C, part of processing circuit 133 is internal to device under test 101 and the remainder of processing circuit 133 is external to device under test 101. Specifically, distributed processing circuit 133 comprises a data reducing circuit 151 and a data analyzer 153. Data reducing circuit 151 is internal to device under test 101 and data analyzer 153 is external to device under test 101. A signal path that conveys phase signal 123 extends within device under test 101 from phase comparator 121 to the input of data reducing circuit 151. Data reducing circuit 151 has an output connected to the input of data analyzer 153. Typically, one or more pins of the package (not shown) of device under test 101 provide the connection between the output of data reducing circuit 151 and the input of data analyzer 153. In the example shown, the device package has a test access port 137 that provides the connection between the output of data reducing circuit 151 and the input of data analyzer 153.

During testing of device under test 101, phase comparator 121 generates phase signal 123, and data reducing circuit 151 applies a data reduction process to phase signal 123 to generate a reduced data rate phase signal 155. Reduced data rate phase signal 155 has a substantially lower data rate than phase signal 123 such that reduced data rate signal 155 is relatively easy to transmit to data analyzer 153 via one or more pins of the package of device under test 101. Data analyzer 153 receives reduced data rate phase signal 155 from data reducing circuit 151 and processes reduced data rate phase signal 155 to determine parametric information 135 about device under test 101. Data analyzer 153 outputs parametric information 135 pertaining to I/O circuit 103. Additionally, or alternatively, data analyzer 153 provides parametric information 135 to other devices, computers, or output components (not shown) constituting part of test system 100. Additionally, or alternatively, data analyzer 153 returns parametric information 135 to device under test 101.

Data reducing circuit 151 processes phase signal 123 using a data compression or a data filtering process. Additionally, data reducing circuit 151 is considerably less complex and uses substantially less storage than the entire processing circuit 133. Consequently, data reducing circuit 151 is substantially more feasibly accommodated within device under test 101 than the entire processing circuit 133.

The example of test system 100 shown in FIG. 2C may be used to perform remote testing of device under test 101. In such an application, data analyzer 153 is located at a remote site (not shown), remote from device under test 101, and a data link (not shown) extends between data reducing circuit 151 and data analyzer 153 to convey reduced data rate phase signal 155 from device under test 101 to the remote site for analysis. The data link is an Ethernet data link or an Internet-based data link, for example. As will be described below, in some embodiments of the device under test, the I/O circuit comprises a transmitter circuit (not shown) that makes the device under test inherently capable of communicating to a remote site via a data link. Such a device under test can be set to a test mode in which the output of data reducing circuit 151 is connected to the input of the transmitter circuit. The transmitter circuit then transmits reduced data rate phase signal 155 output by data reducing circuit 151 to the remote site for analysis. In another example, a product or a product module of which device under test 101 forms part incorporates a transmitter circuit (not shown) capable of communicating via such communication link. In yet another example, the communication capability is provided by a transmitter circuit (not shown) external to the product or the product module that incorporates device under test 101.

Remote testing of the type just described is typically used to perform in-service testing of device under test 101. In this case, the information signal received at device under test 101 under service conditions provides signal 109. Additionally or alternatively, one or more special test signals can be transmitted to device under test 101 to provide signal 109. As a further alternative, device under test 101 can be capable of being set to a loop-back test mode in which the output of a transmitter (not shown) that additionally constitutes part of the device under test is used to provide signal 109.

The example of test system 100 shown in FIG. 2B may also be used to perform remote testing of device under test 101. In such an application, a data link (not shown) is connected to receive parametric information 135 generated by processing circuit 133. The data link is an Ethernet data link or an Internet-based data link, for example. The bandwidth of such link may be less than that used to perform remote testing using the example shown in FIG. 2C. A transmitter circuit (not shown) that forms part of the device under test or that is associated with the device under test may be used to transmit the parametric information to the remote site in a manner similar to that described above with reference to transmitting reduced data rate phase signal 155 to a remote site.

Figure 3:
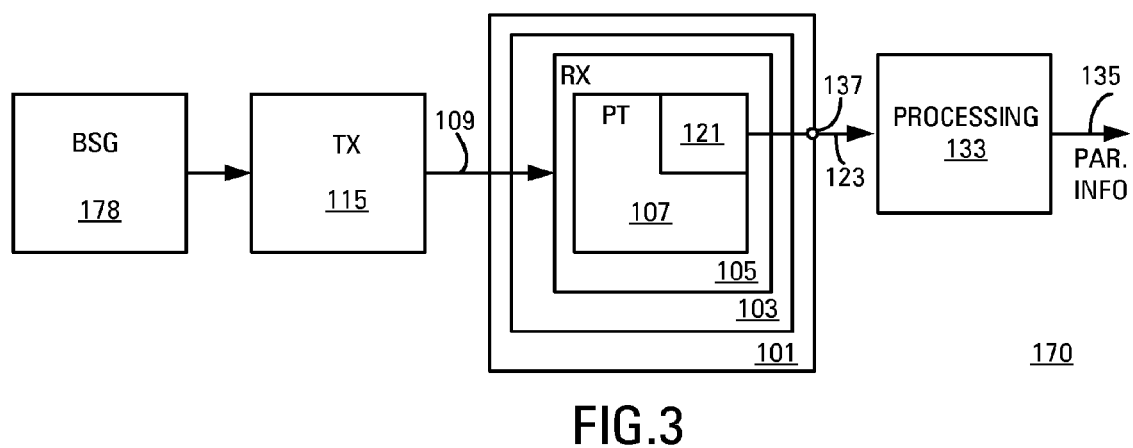
FIG. 3 is a block diagram showing an example of a test system in accordance with a second embodiment of the invention.

Not all signal generators useable as signal generator 108 are capable of conveniently producing waveforms that accurately emulate the full gamut of waveforms receiver circuit 105 may encounter in in-service operation. Such waveforms are more conveniently generated by a transmitter circuit in response to a bit sequence. FIG. 3 is a block diagram showing an example of a test system 170 in accordance with a second embodiment of the invention in which the test system additionally comprises a transmitter circuit that generates signal 109 that is received by device under test 101. In this embodiment, the parametric information pertains to receiver circuit 105 that constitutes at least part of the I/O circuit 103 of device under test 101.

In the example of test system 170 shown, processing circuit 133 is external to device under test 101, as described above with reference to FIG. 2A. Processing circuit 133 may alternatively be internal to device under test 101, as described above with reference to FIG. 2B, or part of processing circuit 133 may be internal to device under test 101 and the remainder of processing circuit 133 may be external to device under test 101, as described above with reference to FIG. 2C.

In addition to processing circuit 133, test system 170 comprises a transmitter circuit 115 and a bit sequence generator 178. The output of bit sequence generator 178 is connected to the input of transmitter circuit 115 and the output of transmitter circuit 115 is connected to the input of device under test 101. Transmitter circuit 115 provides signal 109 to the input of receiver circuit 105 of device under test 101 in response to a bit sequence generated by bit sequence generator 178.

The parametric information 135 generated by processing circuit 133 pertains to the combination of transmitter circuit 115 and receiver circuit 105. However, the desired parametric information pertaining to receiver circuit 105 can be obtained from parametric information 135. With respect to some types of parametric information, transmitter circuit 115 contributes negligibly to the parametric information pertaining to the combination, regardless of the performance of transmitter circuit 115. With respect to other types of parametric information, transmitter circuit 115 can be fabricated and/or adjusted such that it contributes negligibly to the parametric information pertaining to the combination. Consequently, with respect to these types of parametric information, the parametric information 135 pertaining to the combination can be regarded as pertaining to receiver circuit 105 alone. With respect to still other types of parametric information, the contribution of transmitter circuit 115 to parametric information 135 pertaining to the combination can be characterized. The parametric information 135 pertaining to the combination can then be corrected for the contribution of transmitter circuit 115 to determine the parametric information pertaining to receiver circuit 105. In one example, the contribution of transmitter circuit 115 to parametric information 135 is characterized using a technique similar to that described below with reference to FIG. 5.

Figure 4:
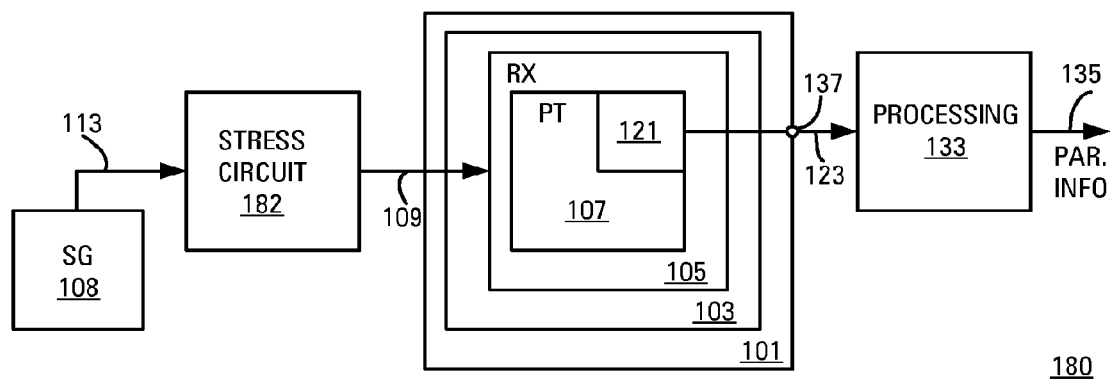
FIG. 4 is a block diagram showing an example of a test system in accordance with a third embodiment of the invention.

Not all signal generators useable as signal generator 108 are capable of conveniently producing waveforms that accurately emulate the degradation of waveforms resulting from imperfect transmitter circuits and imperfect transmission systems. FIG. 4 is a block diagram showing an example of a test system 180 in accordance with a third embodiment of the invention in which the test system comprises a stress circuit interposed between the signal generator and the input of the device under test. In this embodiment, the parametric information pertains to receiver circuit 105 that constitutes at least part of the I/O circuit of device under test 101.

In the example of test system 170 shown, processing circuit 133 is external to device under test 101, as described above with reference to FIG. 2A. Processing circuit 133 may alternatively be internal to device under test 101, as described above with reference to FIG. 2B, or part of processing circuit 133 may be internal to device under test 101 and the remainder of processing circuit 133 may be external to device under test 101, as described above with reference to FIG. 2C.

In the example of test system 180 shown in FIG. 4, in addition to signal generator 108 and processing circuit 133, test system 180 additionally comprises a stress circuit 182. Stress circuit 182 is external to device under test 101 and is interposed between the output of signal generator 108 and the input of device under test 101. Stress circuit 182 degrades certain properties of input signal 113 generated by signal generator 108 to generate signal 109 with properties that test the ability of receiver circuit 105, as indicated by parametric information 135, to receive a non-ideal signal successfully. In an example, signal 109 generated by stress circuit 182 causes slew-rate limiting in receiver circuit 105.

A stress circuit similar to stress circuit 182 may be interposed between the output of transmitter circuit 115 and the input of device under test 101 in the example of test system 170 described above with reference to FIG. 3.

Figure 5:
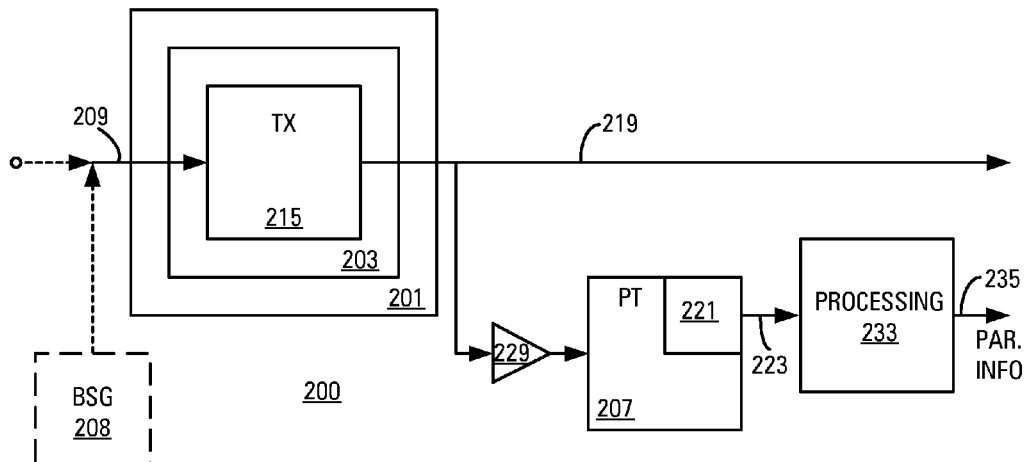
FIG. 5 is a block diagram showing an example of a test system in accordance with a fourth embodiment of the invention.

FIG. 5 is a block diagram showing an example of a test system 200 in accordance with a fourth embodiment of the invention. Test system 200 is configured to test a device under test 201 having an I/O circuit 203 that comprises a transmitter circuit 215. The parametric information generated by test system 200 pertains to transmitter circuit 215.

Test system 200 comprises a phase tracking circuit 207, a high-impedance buffer amplifier 229 and a processing circuit 233, all of which are external to device under test 201. Phase tracking circuit 207 comprises a phase comparator 221. High-impedance buffer circuit 229 couples the output signal 219 output by transmitter circuit 215 to the input of phase-tracking circuit 207 while imposing a negligible additional load on the output of transmitter circuit 215. In an embodiment, the input of buffer amplifier 229 is located close to the output of transmitter circuit 215 to minimize any degradation of output signal 219 by transmission from the output of transmitter circuit 215 to the input of buffer amplifier 229. However, in embodiments in which no other load is applied to the output of transmitter circuit 215, buffer circuit 229 may be omitted. Phase tracking circuit 207, phase comparator 221 and processing circuit 233 are similar in structure and operation to phase tracking circuit 107, phase comparator 121 and processing circuit 133, respectively, described above.

Test system 200 provides a signal 209 to device under test 201. The example of test system 200 shown additionally comprises a bit sequence generator 208 having its output connected to the input of transmitter circuit 215. Thus, in the example shown, signal 209 generated by bit sequence generator 208 is received at device under test 201, specifically at the input of transmitter circuit 215. The connection between bit sequence generator 208 and the input of transmitter circuit 215 is typically provided by one or more pins of the package (not shown) of device under test 201. In another example, signal 209 is provided by a signal source (not shown) external to test system 200. In this case, bit sequence generator 208 need not be present in test system 200.

To test device under test 201, signal 209 is supplied to the input of transmitter circuit 215. In response to signal 209, transmitter circuit 215 generates transmitter output signal 219 that is received at the input of phase tracking circuit 207 via high-impedance buffer amplifier 229. In phase tracking circuit 207, phase comparator 221 receives transmitter output signal 219 and generates phase signal 223 in response thereto, in a manner similar to that described above. Phase tracking circuit 207 feeds phase signal 223 to processing circuit 233. Processing circuit 233 processes phase signal 223 generated by phase tracking circuit 207 to determine parametric information 235 pertaining to the I/O circuit 203 of device under test 201.

In the example shown, parametric information 235 pertains to the combination of transmitter circuit 215 and phase tracking circuit 207. However, the desired parametric information pertaining to transmitter circuit 215 alone can be obtained from parametric information 235. With respect to some types of parametric information, phase tracking circuit 207 contributes negligibly to the parametric information pertaining to the combination, regardless of the performance of phase tracking circuit 207. With respect to other types of parametric information, phase tracking circuit 207 can be fabricated and/or adjusted such that it contributes negligibly to the parametric information pertaining to the combination. Consequently, with respect to these types of parametric information, the parametric information 235 pertaining to the combination can be regarded as pertaining to transmitter circuit 215 alone. With respect to still other types of parametric information, the contribution of phase tracking circuit 207 to parametric information 235 pertaining to the combination can be characterized. The parametric information 235 pertaining to the combination can then be corrected for the contribution of phase tracking circuit 207 to determine the parametric information pertaining to transmitter circuit 215 alone. In one example, the contribution of phase tracking circuit 207 to parametric information 235 is characterized using a technique similar to that described above with reference to FIG. 2A.

Figure 6:
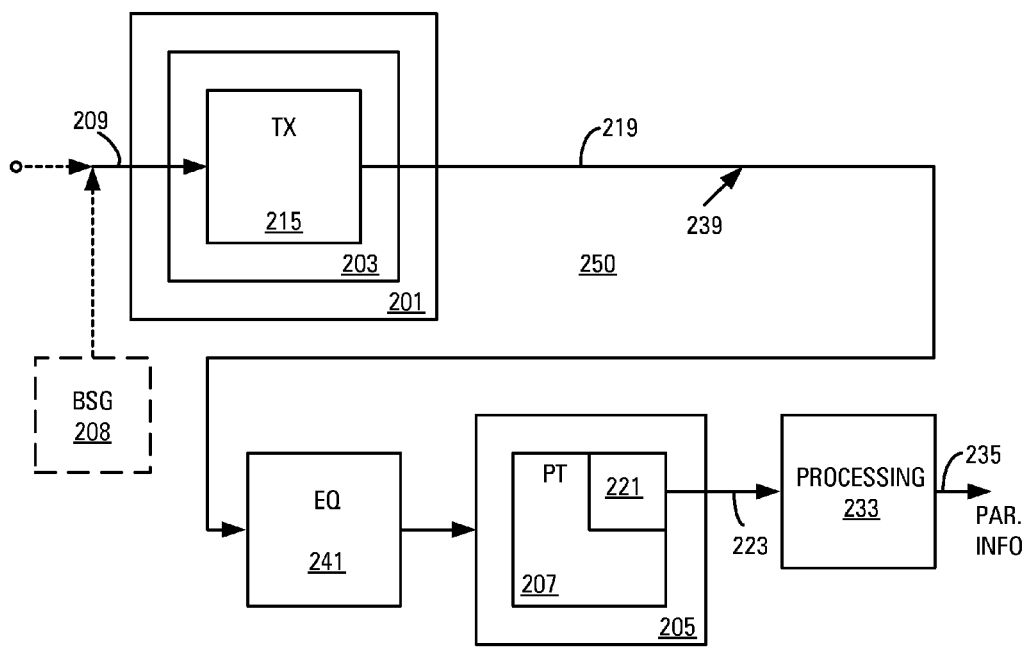
FIG. 6 is a block diagram showing an example of a test system in accordance with a fifth embodiment of the invention.

In some embodiments of a test system suitable for testing a device under test whose I/O circuit comprises a transmitter circuit, physical constraints require that the device under test be located a substantial distance from the phase tracking circuit. FIG. 6 is a block diagram showing an example of a test system 250 in accordance with a fifth embodiment of the invention in which the phase tracking circuit is located a substantial distance from the device under test. Test system additionally comprises a receiver circuit 205 of which phase tracking circuit 207 constitutes part. The output of transmitter circuit 215 is coupled to the input of receiver circuit 205 by a transmission medium 239 of substantial length. Test system 250 additionally comprises an equalizer circuit 241 interposed between the end of transmission medium 239 remote from device under test 201 and the input of receiver circuit 205. Equalizer 241 is configured to correct for the degradation of output signal 219 caused by transmitting the output signal through transmission medium 219. For example, equalizer 241 can be configured to remove jitter caused by transmitting output signal 219 via transmission medium 239. Removing such jitter prevents the jitter from degrading the waveform of output signal 219 as received by phase tracking circuit 207. Equalizers and their adjustment are described in more detail below with reference to FIGS. 10-12.

Examples of a test system in accordance with embodiments of the invention configured to test a device under test 301 having an I/O circuit 303 that comprises a receiver circuit 105 and a transmitter circuit 215 will be described next with reference to FIGS. 7, 8 and 9. In the examples described, the processing circuit is external to the device under test. Alternatively, the processing circuit may be internal to the device under test, as described above with reference to FIG. 2B. As a further alternative, part of the processing circuit may be internal to the device under test and the remainder of the processing circuit may be external to the device under test, as described above with reference to FIG. 2C.

Figure 7:
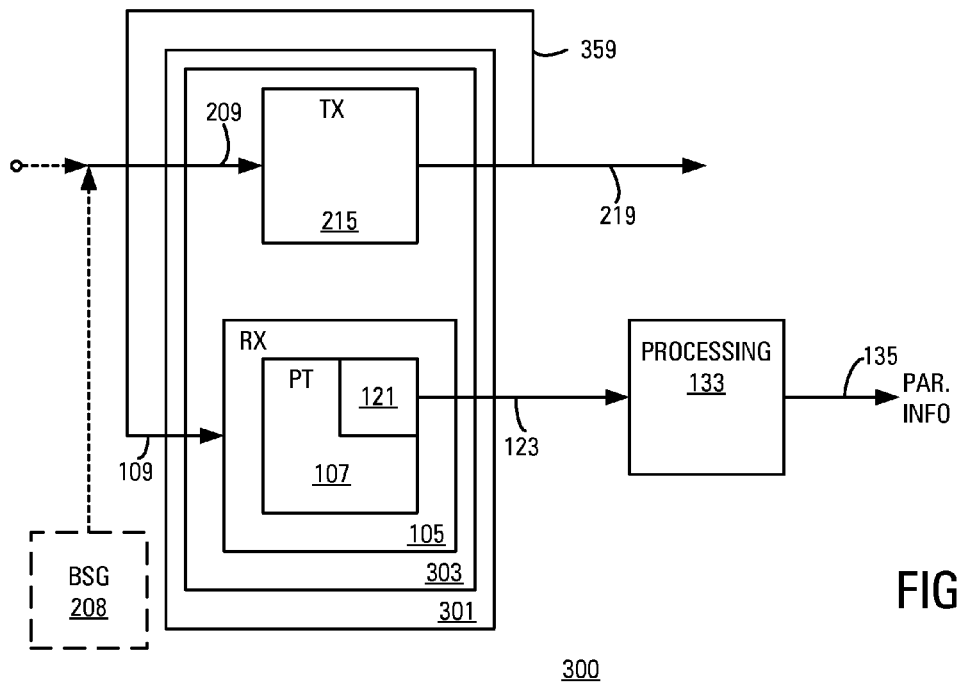
FIG. 7 is a block diagram showing an example of a test system in accordance with a sixth embodiment of the invention.

FIG. 7 is a block diagram showing an example of a test system 300 in accordance with a sixth embodiment of the invention. Test system 300 generates parametric information pertaining to the combination of the receiver circuit 105 and the transmitter circuit 215 of the I/O circuit 303 of device under test 301. Parametric information pertaining to receiver circuit 105 alone and to transmitter circuit 215 alone may be derived from the parametric information pertaining to the combination.

Test system 300 comprises a loop-back signal path 359 that extends from the output of transmitter circuit 215 to the input of receiver circuit 105. In the example shown, loop back signal path 359 is external to device under test 301: loop back signal path 359 may alternatively be internal to device under test 301. Test system 300 additionally comprises processing circuit 133, as described above, external to device under test 301.

Test system 300 provides a signal 209 to device under test 301. The example of test system 300 shown additionally comprises a bit sequence generator 208 having its output connected to the input of transmitter circuit 215. Thus, in the example shown, signal 209 generated by bit sequence generator 208 is received at device under test 301, specifically at the input of transmitter circuit 215. The connection between bit sequence generator 208 and the input of transmitter circuit 215 is typically provided by one or more pins of the package (not shown) of device under test 301. In another example, signal 209 is provided by a signal source (not shown) external to test system 300. In this case, bit sequence generator 208 need not be present in test system 300.

In test system 300, receiver circuit 105 receives signal 109 from loop-back signal path 359. Test system 300 may additionally comprise a signal generator (not shown) similar to signal generator 108 described above with reference to FIG. 2A and a selector (not shown) having inputs connected to the output of the signal generator and to loop-back signal path 359 and an output that provides signal 109 to receiver circuit 105.

Test system 300 tests device under test 301 as follows: signal 209 is applied to the input of transmitter circuit 215. In response to signal 209, transmitter circuit 215 generates transmitter output signal 219. Output signal 219 is coupled to the input of receiver circuit 105 by loop-back signal path 359 to provide signal 109. In receiver circuit 105, phase comparator 121 generates phase signal 123 in response to signal 109 and outputs the phase signal to processing circuit 133. Processing circuit 133 processes phase signal 123 generated by phase comparator 121 in phase tracking circuit 107 to determine parametric information 135. Parametric information 135 pertains to I/O circuit 303, i.e., to a combination of receiver circuit 105 and transmitter circuit 215.

Parametric information 135 may be analyzed to determine parametric information pertaining to receiver circuit 105 alone and pertaining to transmitter circuit 215 alone, as described above with reference to FIGS. 3 and 5. In aid of this, additional parametric information pertaining to receiver circuit 105 may be obtained by substituting a signal generator similar to signal generator 108 described above with reference to FIG. 2A for loop-back signal path 359 to provide signal 109 to receiver circuit 105. Parametric information pertaining to receiver circuit 105 alone is then derived from the phase signal output by phase comparator 121 in response to signal 109 generated by signal generator 108. The parametric information pertaining to receiver circuit 105 alone can then be used to correct the parametric information pertaining to the combination to determine the parametric information pertaining to transmitter circuit 215 alone. As noted above, some types of parametric information pertaining to the combination pertain to the transmitter circuit alone regardless of the performance of the receiver circuit.

Figure 8:
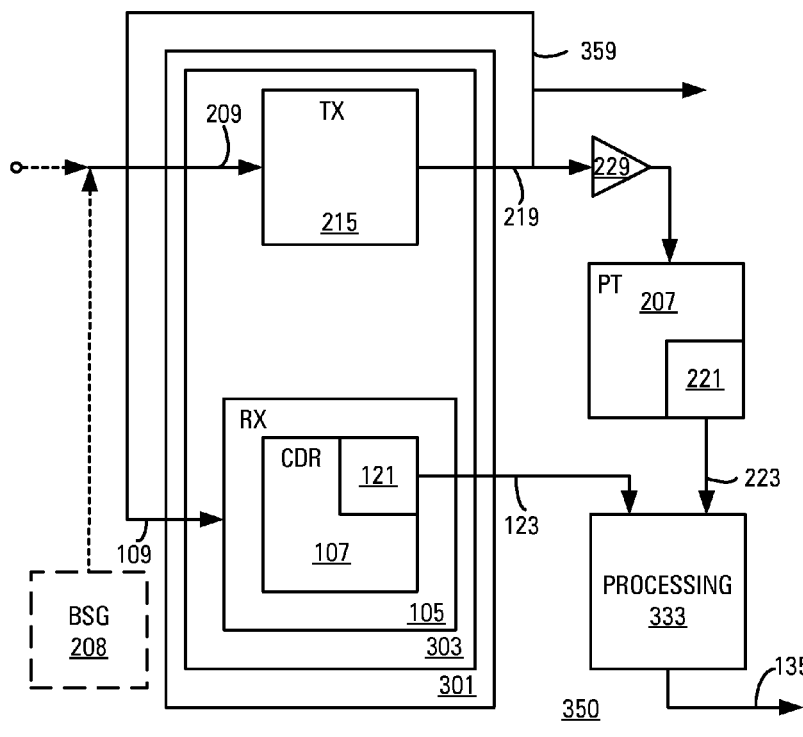
FIG. 8 is a block diagram showing an example of a test system in accordance with a seventh embodiment of the invention.

FIG. 8 is a block diagram showing an example of a test system 350 in accordance with a seventh embodiment of the invention configured to test device under test 301. In addition to above-described loop-back signal path 359 that extends from the output of transmitter circuit 215 to the input of receiver circuit 105, test system 350 comprises external phase tracking circuit 207 and high-impedance buffer circuit 229, described above with reference to FIG. 5 and a processing circuit 333, all external to device under test 301. High-impedance buffer circuit 229 couples the output signal 219 output by transmitter circuit 215 to the input of external phase-tracking circuit 207 while imposing a negligible additional load on the output of transmitter circuit 215.

Processing circuit 333 is similar to processing circuit 133 described above with reference to FIG. 2A, but differs in that it has two inputs and a control input (not shown). The state of a control signal (not shown) applied to the control input determines which of the inputs is activated. One of the inputs of processing circuit 333 is connected to receive phase signal 123 from the phase comparator 121 of phase tracking circuit 107 that constitutes part of device under test 301. The other of the inputs of processing circuit 333 is connected to receive phase signal 223 from the phase comparator 221 of external phase tracking circuit 207.

Test system 350 provides signal 209 to device under test 301. The example of test system 350 shown additionally comprises a bit sequence generator 208 having its output connected to the input of transmitter circuit 215. Thus, in the example shown, signal 209 generated by bit sequence generator 208 is received at device under test 301, specifically at the input of transmitter circuit 215. The connection between bit sequence generator 208 and the input of transmitter circuit 215 is typically provided by one or more pins of the package (not shown) of device under test 301. In another example, signal 209 is provided by a signal source (not shown) external to test system 300. In this case, bit sequence generator 208 need not be present in test system 300.

In test system 350, receiver circuit 105 receives signal 109 from loop-back signal path 359. Test system 350 may additionally comprise a signal generator (not shown) similar to signal generator 108 described above with reference to FIG. 2A and a selector (not shown) having inputs connected to the output of the signal generator and to loop-back signal path 359 and an output that provides signal 109 to receiver circuit 105.

Test system 350 tests device under test 301 as follows: signal 209 is applied to the input of transmitter circuit 215. In response to signal 209, transmitter circuit 215 generates transmitter output signal 219. Output signal 219 is coupled to the input of external phase tracking circuit 207 by high-impedance buffer circuit 229. In external phase tracking circuit 207, phase comparator 221 generates phase signal 223 in response to output signal 219. Processing circuit 333 is set to activate its input connected to receive phase signal 223. Processing circuit 333 processes phase signal 223 generated by phase comparator 221 in external phase tracking circuit 207 to determine parametric information 135 pertaining to the combination of the transmitter circuit 215 of device under test 301 and external phase tracking circuit 207. Parametric information pertaining to transmitter circuit 215 alone can be extracted from parametric information 135, as described above with reference to FIG. 5.

The state of the control signal (not shown) provided to processing circuit 333 is changed to activate the input of processing circuit 333 connected to receive phase signal 121 generated by phase comparator 121 in receiver circuit 105 in response to signal 109. Processing circuit 133 processes phase signal 123 generated by phase comparator 121 to determine parametric information 135 pertaining to the I/O circuit 303 of device under test 301. In the example shown, parametric information 135 pertains to the combination of receiver circuit 105 and transmitter circuit 215. Parametric information pertaining to receiver circuit 105 alone can be extracted from parametric information 135, as described above with reference to FIG. 3. The parametric information pertaining to transmitter circuit 215 alone, obtained as just described, can be used in the process of extracting the parametric information pertaining to receiver circuit 105 alone.

In some instances, transmitter circuit 215 generates symbol patterns that a typical signal generator similar to signal generator 108 is incapable of providing but that are needed to test receiver circuit 105 under stress conditions. FIG. 9 is a block diagram showing an example of a test system 400 in accordance with an eighth embodiment of the invention. Test system 400 is configured to test device under test 301. Specifically, test system 400 tests the receiver circuit 105 of I/O circuit 303, optionally under stress conditions, using a symbol pattern generated by the transmitter circuit 215 of the I/O circuit.

Figure 9:
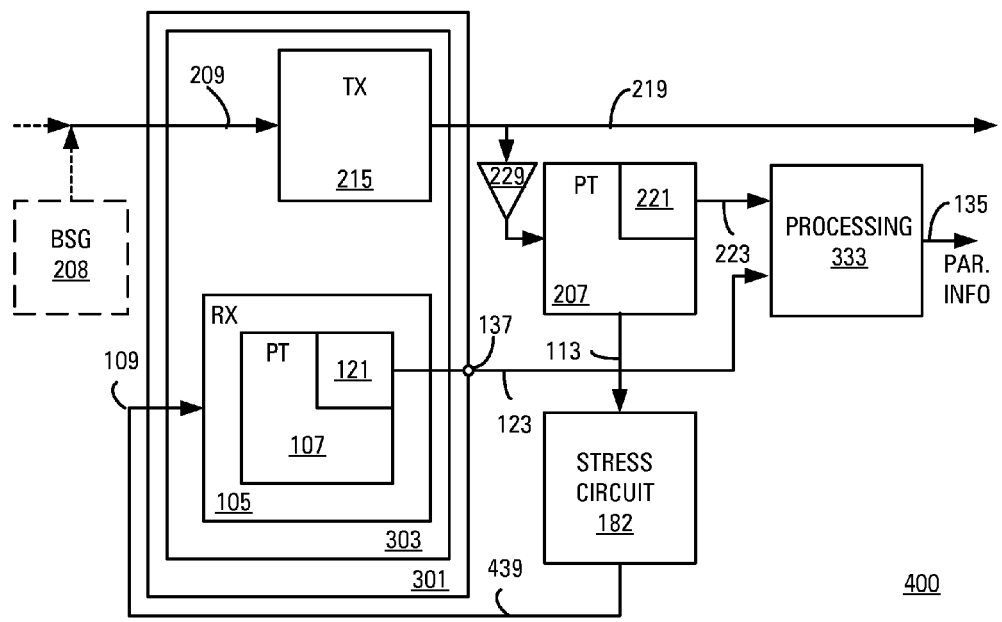
FIG. 9 is a block diagram showing an example of a test system in accordance with a eighth embodiment of the invention.

Test system 400 shown in FIG. 9 is based on test system 350 described above with reference to FIG. 8, and corresponding elements are indicated using the same reference numerals. Test system 400 additionally comprises stress circuit 182. The input of stress circuit 182 is connected to the recovered data output of external phase tracking circuit 207 so that stress circuit 182 receives a clean input signal 113 derived from the output signal 219 of transmitter circuit 215 by external phase tracking circuit 207. The output of stress circuit 182 is connected to the input of receiver circuit 105 via a short, high-quality signal path 439 to provide signal 109 to device under test 301.

During testing of device under test 301, transmitter circuit 215 generates output signal 219 in response to signal 209 generated by test program generator 208. External phase tracking circuit 207 performs a clock and data recovery operation on output signal 219. The clock and data recovery operation removes any defects in the quality of output signal 219 and presents clean input signal 113 to the input of stress circuit 182. Accordingly, all waveform defects in signal 109 are those deliberately introduced by stress circuit 182.

Figure 10:
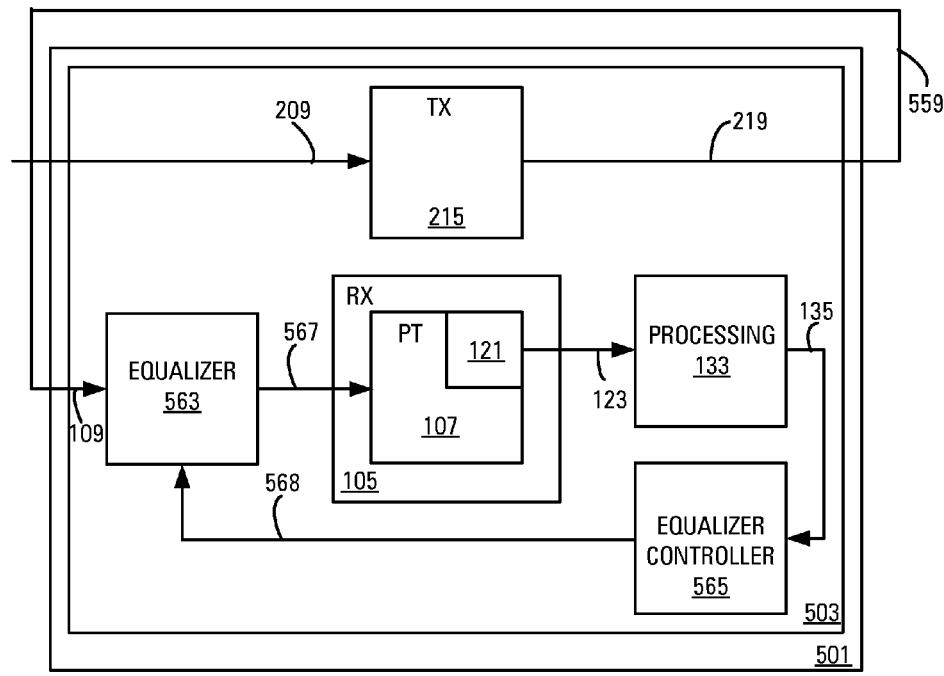
FIG. 10 is a block diagram showing an example of a test system in accordance with a ninth embodiment of the invention.

FIG. 10 is a block diagram showing a test system 500 in accordance with to a ninth embodiment of the invention. Test system 500 is configured to test a device under test 501 having an I/O circuit 503 that comprises receiver circuit 105 and a variable equalizer 563. Test system 500 adjusts variable equalizer 563 in response to the parametric information derived from phase signal 123 output by receiver circuit 105 to compensate for errors in a signal received at the input of receiver circuit 105 in device under test 501. In the example shown, the I/O circuit 503 of device under test 501 additionally comprises transmitter circuit 215. In other examples, I/O circuit 503 has only a receiver circuit.

In device under test 501, variable equalizer 563 is connected in series between the input pins of the package (not shown) of device under test 501 and the input of receiver circuit 105. The input pins are the pins of the package that, in in-service operation of device under test 501, receive an input signal and that, when device under test 501 is being tested, receive signal 109. In in-service operation of device under test 501, equalizer 563 equalizes the signal received at the input pins of device under test 501 and passes an equalized input signal 567 to the input of receiver circuit 105.

In the example shown in FIG. 10, test system 500 additionally comprises a transmission medium 559 that extends externally of device under test 501 from the output of transmitter circuit 215 to the input of equalizer 563. When device under test 501 is being tested, equalizer 563 receives signal 109 from the output of transmitter circuit 215 via transmission medium 559. Equalizer 563 equalizes signal 109 and passes an equalized signal 567 to the input of receiver circuit 105. The length and signal transmission quality of transmission medium 559 are such as to allow transmission medium 559 to emulate a typical or worst-case transmission medium that provides an input signal to device under test 501 during in-service operation. Alternatively, the output of transmitter circuit 215 and the input of equalizer 563 may be linked by a stress circuit similar to above-described stress circuit 182 (FIG. 9). The properties of the stress circuit are set to cause signal 109 to emulate a typical or worst-case input signal received by device under test 501 during in-service operation.

Alternatively, signal 109 may be provided by a signal source (not shown) external to test system 500. For example, test system 500 may be used to adjust variable equalizer 563 during in-service operation of device under test 501. In this case, transmission medium 559 is omitted, and signal 109 is an in-service input signal received by device under test 501 from the transmission medium (not shown) connected to the input pins of device under test 501 during in-service operation.

Test system 500 additionally comprises an equalizer controller 565 having an input connected the output of processing circuit 133 and an output connected to the control input of equalizer 563. Equalizer controller 565 receives parametric information 135 generated by processing circuit 133 and provides an equalization control signal 568 to equalizer 563.

In one example, equalizer 563 and equalizer controller 565 are similar in structure to those described by Seet et al. in U.S. Pat. No. 6,760,551, incorporated by reference. Parametric information 135 provides the input needed by equalizer controller 565 to generate equalization control signal 568 that defines the properties of equalizer 563 such that the equalizer cancels deleterious effects of the transmission medium 559 on signal 109 and thereby optimizes equalized signal 567.

In the example shown in FIG. 10, processing circuit 133 and equalizer controller 565 are internal to device under test 501. Alternatively, processing circuit 133 may be external to device under test 501 as described above with reference to FIG. 2A, or part of processing circuit 133 may be internal to device under test 501 and the remainder of processing circuit 133 may be external to device under test 501, as described above with reference to FIG. 2C. Equalizer controller 565 may alternatively be external to device under test 501. In another alternative, equalizer controller 565 and processing circuit 133 constitute at least part of an operational circuit connected to device under test 501 during in-service operation of device under test 501.

In embodiments in which either or both of processing circuit 133 and equalizer controller 565 are external to device under test 501, device under test 501 additionally comprises a memory circuit (not shown) that memorizes a parameter indicating the setting of equalizer 563. This allows equalizer 563 to continue to provide the appropriate equalization when device under test 501 is placed in service. The memory circuit may be part of equalizer 563, for example. In this case, the memorized parameter is the value of equalizer control signal 568 received by equalizer 563 when the equalization process described below is complete. In another example, the memory circuit is part of equalizer controller 565, and the memorized parameter is the value of the parametric information 135 received by equalizer controller 565 when the equalization process described below is complete.

Figure 11:
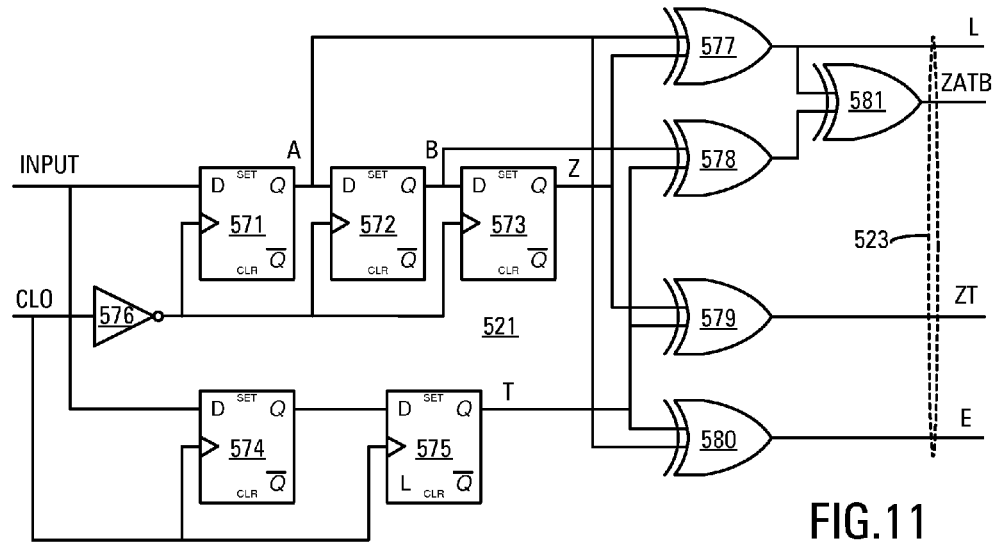
FIG. 11 is a block diagram of an example of a phase comparator suitable for use in the device under test tested by the embodiment of the test system shown in FIG. 10.

FIG. 11 is a schematic drawing showing an example of a phase comparator 521 that may be used as phase comparator 121 in the phase tracking circuit 107 of the receiver circuit 105 of device under test 501. Phase comparator 521 generates an embodiment 523 of phase signal 123 from which phase information suitable for controlling variable equalizer 563 can easily be obtained. In this example, phase tracking circuit 107 is a clock and data recovery circuit (CDR) that generates a clock signal CLOCK in response to transitions in equalized input signal 567 output by equalizer 563. Receiver circuit 105 derives from signal 567 an input signal INPUT that is input into phase comparator 521.

Phase comparator 521 is composed of D-type flip-flops 571, 572, 573 and 574, latch 575, inverter 576, and two-input exclusive-OR (XOR) gates 577, 578, 579, 580 and 581. The clock signal CLOCK generated by phase tracking circuit 107 is connected to the input of inverter 576, the clock input of flip-flop 574 and to the ENABLE input of latch 575. The output of inverter 576 is connected to the clock inputs of flip-flops 571, 572 and 573. Thus flip-flops 571-573 receive an inverted version of clock signal CLOCK.

The input signal INPUT is connected to D-input of flip-flop 571 and the D-input of flip-flop 574. The D-input of flip-flop 572 is connected to the Q-output of flip-flop 571, the D-input of flip-flop 573 is connected to the Q-output of flip-flop 572, and the D-input of latch 575 is connected to the Q-output of flip-flop 574. The Q-outputs of flip-flops 571, 572, 573 and latch 575 provide intermediate signals A, B, Z and T, respectively. The state of intermediate signal T represents the state of input signal INPUT at the current transition of clock signal CLOCK. The states of intermediate signals A, B and Z represent the states of input signal INPUT at the opposite-direction transitions of clock signal CLOCK one half clock period later, one half clock period earlier, and one and one-half clock periods earlier, respectively, than the current transition of clock signal CLOCK.

The Q-output of flip-flop 571 (intermediate signal A) is connected to one input of each of the XOR gates 577 and 580. The Q-output of flip-flop 572 (intermediate signal B) is connected to one input of XOR gate 578. The Q-output of flip-flop 573 (intermediate signal Z) is connected to the other input of XOR gate 577 and to one input of XOR gate 579. The Q-output of latch 575 (intermediate signal T) is connected to the other input of each of XOR gates 578, 579 and 580. The output of XOR gate 577 provides phase signal component L and is additionally connected to one input of XOR gate 581. The output of XOR gate 578 is connected to the other input of XOR gate 581. The output of XOR gate 581 provides phase signal component ZATB. The output of XOR gate 579 provides phase signal component ZT and the output of XOR gate 580 provides phase signal component E. Phase signal components E and L indicate whether the current transition of clock signal CLOCK is early (E) or late (L) relative to the current transition of input signal INPUT. Phase signal component ZATB is the exclusive OR of intermediate signals Z, A, T and B. Phase signal component ZT is the exclusive-OR of intermediate signals Z and T.

When phase signal components ZT and ZATB are in opposite states, i.e., when ZT⊕ZATB is true, where ⊕ denotes XOR, the state of phase signal component ZT or the state of phase signal component ZATB indicates whether input signal INPUT is under- or over-equalized. When phase signals ZATB and ZT are in opposite states, the states of phase signal components ZATB and ZT collectively encode PULSE events (sequences of 0, 1, 0 or 1, 0, 1 in signal INPUT) and RUN events (sequences of 0, 0, 0 or 1, 1, 1 in signal INPUT) and collectively indicate whether equalizer 563 is providing too much or too little equalization. Phase signal components ZT and ZATB being in opposite states, i.e., ZT⊕ZATB being true, indicates the existence of a transition in input signal INPUT. In addition, the state of phase signal component ZATB being true for more than one half of the transitions indicates that input signal INPUT is under equalized. The state of phase signal component ZATB being true for less than half of the transitions indicates that input signal INPUT is over equalized. The state of phase signal component ZATB being true for one half of the transitions indicates that input signal INPUT is optimally equalized. The state of phase signal component ZATB being true for one half of the transitions within a defined tolerance indicates that input signal INPUT is acceptably equalized. Conversely, the state of phase signal component ZT being true for more than one half of the transitions indicates that input signal INPUT is over equalized. The state of phase signal component ZT being true for less than half of the transitions indicates that input signal INPUT is under equalized. The state of phase signal component ZT being true for one half of the transitions indicates that input signal INPUT is optimally equalized. The state of phase signal component ZT being true for one half of the transitions within a defined tolerance indicates that input signal INPUT is acceptably equalized.

In one example of test system 500 shown in FIG. 10, processing circuit 133 arithmetically subtracts phase signal components ZATB and ZT to generate a three-state signal having three possible states (−1, 0 and +1). Equalizer controller 565 integrates, appropriately scales and compares the three-state signal with a reference voltage of zero to provide equalizer control signal 568. In this example, the equalization control loop operates to servo the integrated three-state signal to zero.

Figure 12:
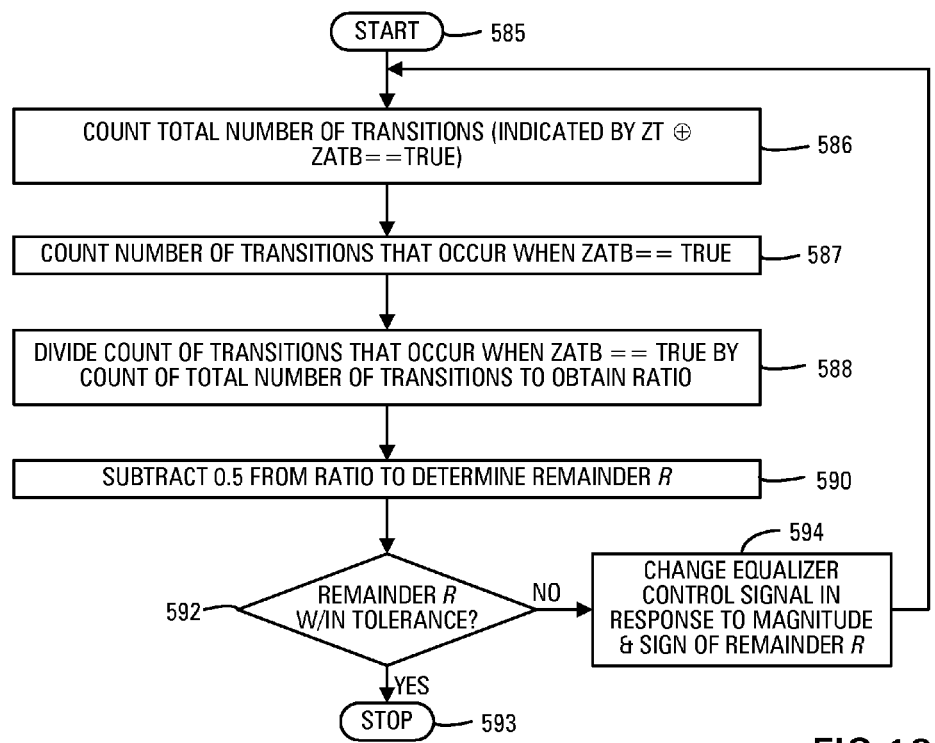
FIG. 12 is a flow chart showing an example of the processing performed by the processing circuit of the test system shown in FIG. 10.

FIG. 12 is a flow chart showing the processing performed by another example of processing circuit 133 in test system 500. Execution starts at block 585. Blocks 586 and 587 are performed during a measurement period. In block 586, a count is made of the total number of transitions of input signal INPUT that occur during the measurement period. Each transition is indicated by phase signal components ZATB and ZT being in opposite states (ZT⊕ZATB=true) In block 587, a count is made of the number of transitions of input signal INPUT that occur during the measurement period when phase signal component ZATB is true. Alternatively, the number of transitions of input signal INPUT that occur during the measurement period when phase signal component ZT is true may be counted in block 587.

The remaining operations are performed during a calculation period that may run consecutively with the above-described measurement period or concurrently with a next measurement period. In block 588, the number of transitions counted in block 587 is divided by the total number of transitions counted in block 586 to obtain a ratio. In block 590, 0.5 is subtracted from the ratio to determine a remainder R.

An optimum setting of equalizer 563 is indicated by a value of remainder R of zero (i.e., the ratio calculated in block 588 is equal to 0.5), and an acceptable setting of equalizer 563 is indicated by a value of remainder R within a predetermined tolerance of zero. The tolerance depends on the criticality of the application, the tolerance being smaller in more critical applications. In block 592, a test is performed to determine whether remainder R is within the tolerance. A YES result in block 592 causes execution to advance to block 593, where execution stops with equalizer 563 adjusted within a precision corresponding to the tolerance used in block 592. Alternatively, in an embodiment in which equalizer 563 is continuously adjusted to take account of variations in the transmission conditions providing signal 109 (FIG. 10) to its input, a YES result in block 592 causes execution to return to block 586 to await the start of the next measurement period.

A NO result in block 592 causes execution to advance to block 594, where equalizer control signal 568 is changed in response to the magnitude and sign of remainder R determined in block 590. Execution then returns to block 586 to await the start of the next measurement period.

Figure 13A:
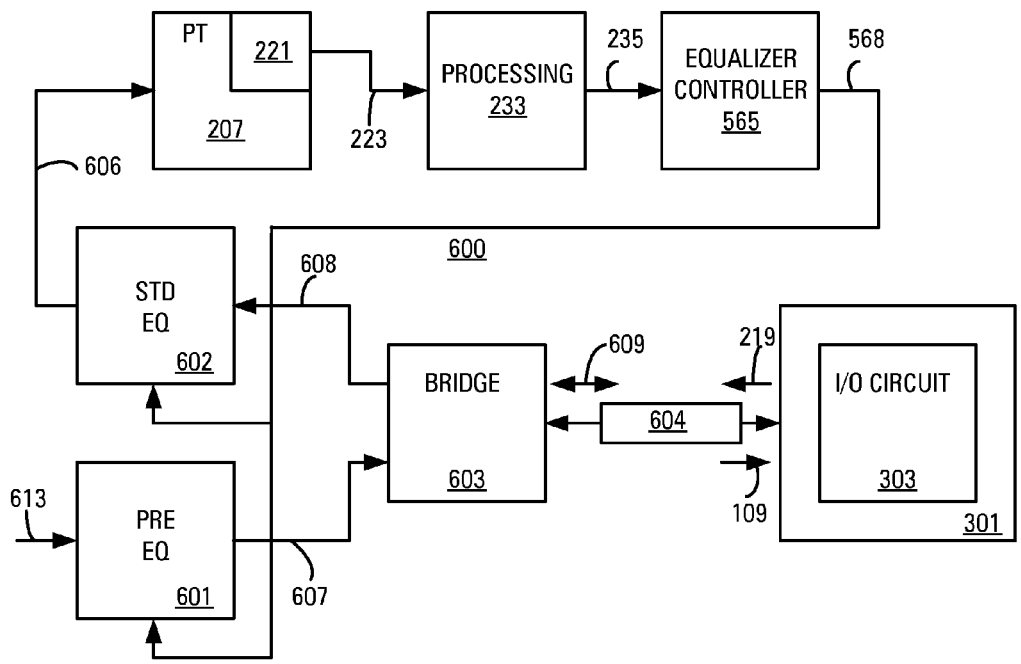
FIG. 13A is a block diagram showing an example of a test system in accordance with a tenth embodiment of the invention in its operational mode.

FIG. 13A shows a block diagram of a test system 600 in accordance with a tenth embodiment of the invention in which accurate parametric information is obtained notwithstanding the device under test being located remotely from the test system. In the example shown, device under test 301 comprises I/O circuit 303 that in turn comprises transmitter circuit 215 (not shown) and receiver circuit 105 (not shown). Test system 600 is external to device under test 501 and comprises a pre-emphasis equalizer 601, a standard equalizer 602, a bridge circuit 603, phase tracking circuit 207 and processing circuit 223 described above with reference to FIG. 5, and equalizer controller 565 described above with reference to FIG. 10.

Test system 600 is linked to device under test 301 via transmission medium 604, which has non-ideal transmission characteristics. The distal end of transmission medium 604, remote from test system 600, is connected to the output of the transmitter circuit and to the input of the receiver circuit of device under test 501. The proximal end of transmission medium 604 is connected to bridge circuit 603. Bridge circuit 603 additionally has an input connected to the output of pre-emphasis equalizer 601 and an output connected to the input of standard equalizer 602. Standard equalizer 602 additionally has an output connected to the input of external phase tracking circuit 207.

Pre-emphasis equalizer 601 has an input that receives a clean input signal 613, i.e., an input signal having little or no waveform impairment. In one example, clean input signal 613 is generated by a signal generator (not shown, but similar to signal generator 108 described above with reference to FIG. 2A) that forms part of test system 600. Pre-emphasis equalizer 601 pre-emphasizes clean input signal 613 to produce a pre-emphasized signal 607. Pre-emphasized signal 607 is transmitted via bridge circuit 603 to transmission medium 604. Transmission medium 604 transmits pre-emphasized signal 607 to device under test 301 to provide signal 109 received at device under test 301, specifically at the input of the receiver circuit. The non-ideal transmission characteristics of transmission medium 604 degrade the waveform of pre-emphasized signal 607. However, the pre-emphasis applied by pre-emphasis equalizer 601 compensates for the waveform degradation resulting from transmission by transmission medium 604. Hence, signal 109 received at the input of the receiver circuit of device under test 301 has substantially the same waveform as clean input signal 613. Parametric information pertaining to the receiver circuit of device under test 301 is then obtained from the phase signal output by the receiver circuit of device under test 301 in a manner similar to that described above with reference to FIGS. 2A, 2B or 2C as if clean input signal 613 were applied directly to the input of the receiver circuit.

The transmitter circuit of device under test 301 generates a transmitter output signal 219 that is transmitted via transmission medium 604 to test system 600. Transmitter output signal arrives at test system 600 as a returned signal 608 whose waveform is degraded relative to that of transmitter output signal 219 as a result of transmission via transmission medium 604. In test system 600, the signal 609 at the node between bridge circuit 603 and transmission medium 604 comprises pre-emphasized signal 607 and returned signal 608. Bridge circuit 603 subtracts pre-emphasized signal 607 from signal 609 and outputs returned signal 608 to standard equalizer 602. Standard equalizer 602 compensates for the waveform degradation imposed on returned signal 608 by transmission through transmission medium 604 and produces transmitted output signal 606. Transmitted output signal 606 has the same waveform as transmitter output signal 619 output by the transmitter circuit of device under test 301.

Parametric information 235 pertaining to the transmitter circuit of device under test 301 is then obtained by applying transmitted output signal 606 to the input of external phase tracking circuit 207.

Figure 13B:
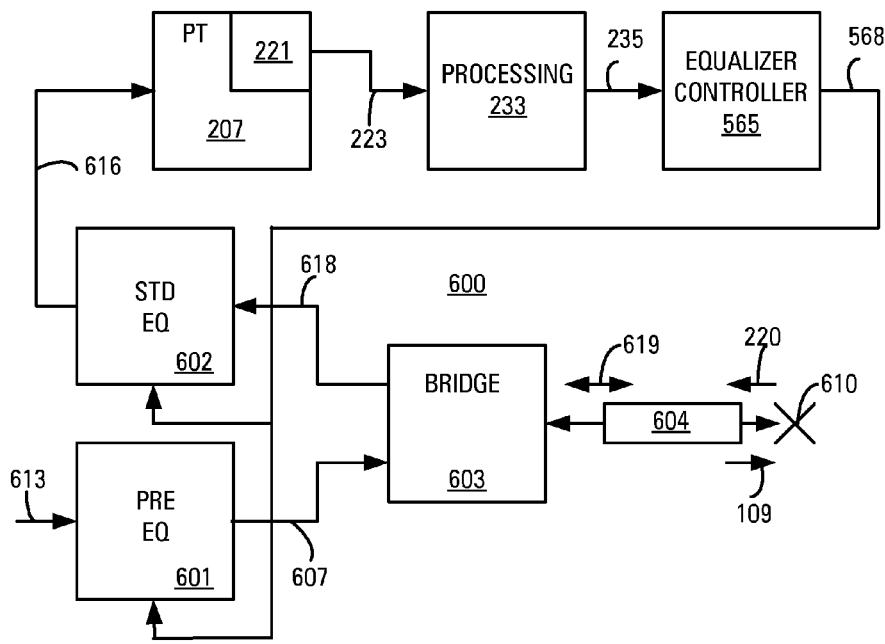
FIG. 13B is a block diagram showing the test system shown in FIG. 13A in its equalizer adjustment mode.

As noted above, pre-emphasis equalizer 601 and standard equalizer 602 have identical characteristics. The effectiveness of the remote testing process just described depends on matching the characteristics of equalizers 601 and 602 to the non-ideal transmission characteristics of transmission medium 604. A method that can be used to tune the characteristics of equalizers 601 and 602 to match the transmission characteristics of transmission medium 604 will be described next with reference to FIG. 13B.

The output of processing circuit 233 is also connected to the input of equalizer controller 565. The output of equalizer controller 565 is connected to the control inputs of each of pre-emphasis equalizer 601 and standard equalizer 602. Equalizer controller 565 receives parametric information 235 from processing circuit 233 and, in response to the parametric information, generates an equalizer control signal 568 that controls the equalization characteristics of pre-emphasis equalizer 601 and standard equalizer 602.

To match the characteristics of equalizers 601 and 602 to the transmission characteristics of transmission medium 604, the end of transmission medium 604 remote from test system 600 is terminated by termination 610. Termination 610 is an electrical open circuit or an electrical short circuit. Clean input signal 613 is fed into pre-emphasis equalizer 601, equalized signal 607 is fed via bridge 603 to transmission medium 604, and signal 109 output by transmission medium 604 is incident on termination 610. Termination 610 reflects signal 109 back into transmission medium 604 as a reflected signal 620.

Reflected signal 620 returns to bridge circuit 603 as returned signal 618. Bridge circuit 618 subtracts equalized signal 607 from signal 619 at the node between bridge circuit 603 and transmission medium 604 and outputs returned signal 618 to standard equalizer 602. Standard equalizer 602 receives returned reflected signal 618 and equalizes the returned reflected signal to generate an equalized reflected signal 616. External phase tracking circuit 207 receives the equalized reflected signal and phase comparator 221 in the phase tracking circuit generates phase signal 223 in response to the equalized reflected signal. Processing circuit 233 generates parametric information 235 from phase signal 223. Equalizer controller 565 operates in response to parametric information 235 to generate equalizer control signal 568 that is supplied pre-emphasis equalizer 601 and standard equalizer 602.

Pre-emphasis equalizer 601 and standard equalizer 602 have identical relationships between their equalization characteristics and equalizer control signal 568. The equalizer control signal adjusts the characteristics of pre-emphasis equalizer 601 and standard equalizer 602 until the equalizers collectively correct the waveform impairments imposed on clean input signal 613 by the round trip through transmission medium 604. Equalizers 601 and 602 have identical characteristics and transmission medium 604 has identical transmission characteristics with respect to transmission in the forward direction, i.e., from test system 600 to device under test 301, and in the reverse direction, i.e., from device under test 301 to test system 600. Consequently, the equalizer adjustment process just described allows pre-emphasis equalizer 601 to compensate individually for the waveform degradation caused by transmission through transmission medium 604 in the forward direction and enables standard equalizer 602 to compensate individually for the waveform degradation caused by transmission through transmission medium 604 in the reverse direction. The equalizer adjustment procedure just described is performed prior to testing device under test 301 remotely using test system 600.

Figure 14A:
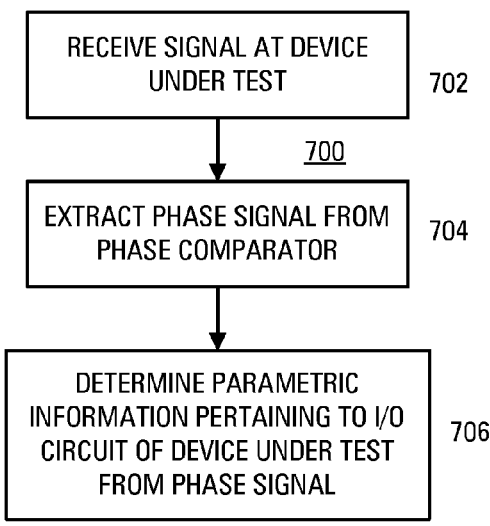
FIG. 14A is a flow chart showing an example of a test method in accordance with an embodiment of the invention.

FIG. 14A is a flow diagram showing an example of a method 700 in accordance with an embodiment of the invention for using a phase comparator to test the I/O circuit of a device under test. In block 702, a signal is received at the device under test. In block 704, a phase signal is extracted from the phase comparator. In block 706, parametric information pertaining to the I/O circuit of the device under test is determined from the phase signal.

In an example of the embodiment just described, the I/O circuit comprises a receiver circuit and the phase comparator is part of a phase tracking circuit that constitutes part of the receiver circuit, as in the I/O circuit 103 of device under test 101 described above with reference to FIGS. 2A-2C. In this example, the parametric information pertains to the receiver circuit. The signal received at the device under test is provided to the input of the receiver circuit by a signal generator. Alternatively, in an embodiment of the method used to perform in-service testing of the device under test, the signal received at the device under test is an in-service signal.

In another example, the I/O circuit comprises a transmitter circuit, the phase comparator is part of a phase tracking circuit that is independent of the transmitter circuit, and the signal received at the device under test is received at the input of the transmitter, as in the I/O circuit 203 of device under test 201 described above with reference to FIG. 5. The phase comparator is external to the device under test. The signal received at the input of the transmitter circuit may be provided by a bit sequence generator or may be an in-service signal. In this example, the parametric information pertains to the transmitter circuit.

In yet another example, the I/O circuit comprises a transmitter circuit and a receiver circuit and the phase comparator is part of a phase tracking circuit that constitutes part of the receiver circuit as in the I/O circuit 303 of device under test 301 described above with reference to FIG. 7. The signal received by the device under test is received at the input of the transmitter circuit. The phase comparator is internal to the device under test. In this example, the parametric information pertains to the combination of the receiver circuit and the transmitter circuit. The parametric information for the combination can be processed as described above to derive parametric information for the transmitter circuit alone. Parametric information pertaining to the receiver circuit alone may be determined by additionally receiving a signal at the input of the receiver circuit, also as described above with reference to FIG. 7.

Figure 14B:
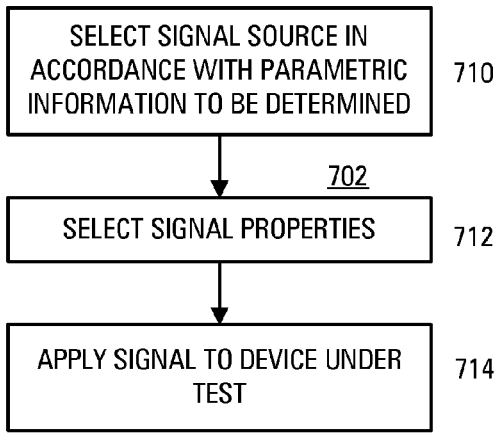
FIG. 14B is a flow chart showing an exemplary embodiment of block 702 shown in FIG. 14A.

FIG. 14B is a flow diagram showing an exemplary embodiment of block 702 of method 700 described above with reference to FIG. 14A. In block 710, a signal source is selected in accordance with the parametric information that is to be determined. Examples of such signal types include a loop-back signal path such as that described above with reference to FIG. 7, an in-service signal source that provides a signal similar to the signal that will be seen by the device under test during in-service operation, and a stressed signal source that provides a signal waveform that is deliberately distorted relative to an ideal signal waveform.

In block 712, signal properties are selected. Examples of signal properties that can be selected include the signal pattern and the signal waveform characteristics. Examples of signal waveform characteristics are frequency, phase and waveform. Using a stress circuit to modify the signal allows specific characteristics to be introduced into the signal to emulate desired operational phenomena and other characteristics.

In block 714, the signal from the source selected in block 710 and with the properties selected in block 712 is applied to the device under test.

Figure 14C:
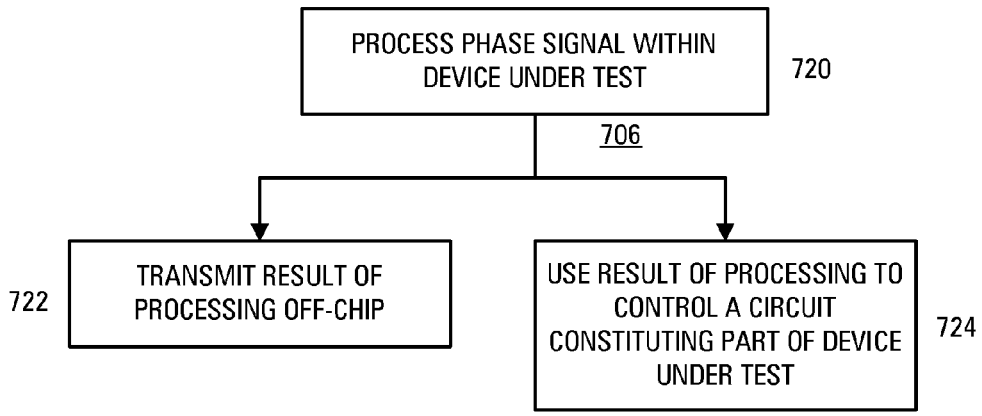
FIG. 14C is a flow chart showing an exemplary embodiment of block 706 shown in FIG. 14A.

FIG. 14C shows a first exemplary embodiment of block 706 of method 700 described above with reference to FIG. 14A. In block 720, the phase signal is processed within the device under test. In block 722, the result of the processing is transmitted off-chip. Examples of the result of the processing include a data-reduced version of the phase signal, and the parametric information derived from the phase signal. Additionally or alternatively, in block 724, the result of the processing is used to control a circuit, e.g., an equalizer, that forms part of the device under test or is external to the device under test but is used together with the device under test, as described above with reference to FIG. 10.

The device under test may be structured to include a digital signal processor (DSP) that is used to process the phase signal in block 720 in certain embodiments of the invention. The use of a DSP to perform some of the processing exemplified herein is described in United States patent application publication no. 2005 0 243 950, incorporated by reference.

Figure 14D:
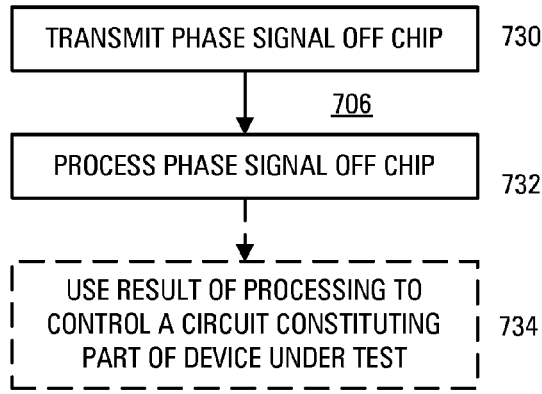
FIG. 14D is a flow chart showing another exemplary embodiment of block 706 shown in FIG. 14A.

FIG. 14D shows a second exemplary embodiment of block 706 of method 700 described above with reference to FIG. 14A. In block 730, the phase signal is transmitted off-chip to an external processing circuit. In block 732, the phase signal is processed off-chip. Optionally, in block 734, the result of the processing is used to control a circuit, e.g., an equalizer, that forms part of the device under test or is external to the device under test but is used together with the device under test In block 730, the phase signal may be transmitted off-chip via a high speed port such as a JTAG test access port.

In an embodiment, the parametric information determined from the phase signal is included in at least one portion of a comprehensive test suite. A comprehensive test suite used with certain embodiments of the invention is described below under heading Comprehensive Test Suite. The parametric information included in the comprehensive test suite may be used to determine whether the device under test performs in accordance with its performance specifications.

Clock-Data Recovery Circuit

When used as a clock and data recovery circuit, examples of above-described phase tracking circuit 107 each comprise a phase-locked loop (PLL) and a sampling circuit that extracts the data signal from the input signal. The PLL typically has a low-pass characteristic that allows the PLL to track the phase of the input signal up to a maximum frequency. Frequencies below the maximum frequency are known as in-band frequencies, while frequencies above the maximum frequency are known as out-of-band frequencies.

Embodiments of a phase tracking circuit incorporating a bang-bang PLL generate the phase signal with a phase-early (E) phase signal component and a phase-late (L) phase signal component. The phase signal components E and L collectively represent three digital states, namely, phase-early (E), phase-late (L) or no-edge. If resources allow for simultaneous acquisition and/or analysis of both phase signal components E and L, both phase signal components are used as the phase signal. In embodiments in which resources are limited but the states of the input signal in response to which the phase signal is generated are known, only one of the phase signal component E and L can be used as the phase signal. The methods and test systems described in this disclosure can work with a phase signal having either one phase signal component E or L or two phase signal components E and L.

In the example just described, the phase signal components E and L are one-bit binary signals one of which indicates whether the VCO signal is early relative to the input signal, the other of which indicates whether the VCO signal is late relative to the input signal. In other examples, each phase signal component is a more than one-bit signal that represents the temporal offset between the VCO signal and the input signal. Substantial additional parametric information pertaining to the device under test can be extracted from a phase signal in which each phase signal component is a two-bit binary signal. Phase signals in which each phase signal component is a more than two bit signal are also possible.

The phase comparator transforms the result of a phase comparison between the input signal and the VCO signal in the PLL into a phase signal composed of either or both of the phase signal components E and L. The phase signal components E and L are conventionally used by a three-mode proportional, integral, derivative (PID) control loop to alter the phase and frequency of the VCO to achieve a VCO signal whose phase is locked to the edges of the input signal. The phase signal components E and L provide a simple binary indication of whether an edge of the input signal occurs before (early) or after (later), i.e., leads or lags, an edge of the VCO signal generated by the VCO. A circuit that assesses whether the PID phase comparator is leading or lagging the reference phase is used to produce a digital signal that is equivalent to the phase signal. The phase signal, together with the PID loop equation parameters, can be used to measure the data phase variation independently of the device under test.

As noted above, receiving an input signal having a known bit pattern at the device under test allows only one of the phase signal components E and L to be used as the phase signal. The missing phase signal component can be inferred, e.g., by performing correlation of the phase signal to the known bit pattern of the input signal. Processing circuit 133 performs a pattern matching procedure between the edges of the phase signal component and the edges of the bit pattern of the input signal. The pattern matching process aligns the edges of the phase signal component with the edges of the bit pattern of the input signal. Once the patterns are matched, those edges of the bit pattern for which there are no corresponding edges of the phase signal component are the edges of the other phase signal component. In one example, the known bit pattern is a pseudo-random bit sequence (PRBS). Processing circuit 133 may perform operations described in U.S. Pat. No. 6,760,551 and above-mentioned United States patent application publication no. 2005 0 243 950. Processing circuit 133 may be embodied as software running on a computer, digital signal processor or other programmable device. Alternatively, processing circuit 133 may be embodied in hardware.

By extracting the phase signal 123 from phase tracking circuit 107 and processing the phase signal using processing circuit 133 implementing well understood techniques such as auto-correlation, cross-correlation, Average Power Spectral Density, Discrete Fourier Transform, etc., as well as heuristic processing methods such as those described below with reference to Example 1, parametric information pertaining to the dynamic performance of the I/O circuit of the device under test can be generated. As noted above, the generated parametric information can be used as part of a comprehensive test suite.

Comprehensive Test Suite

A comprehensive test suite comprises tests and measurements that can be performed during or after manufacture of an electronic device that ensure that the electronic device will perform according to a set of predetermined parametric specifications that will be referred to as a performance specification. A comprehensive test suite can be applied in test contexts such as characterization, manufacturing, calibration, and in-service monitoring. All or a subset of the test suite can be applied. A test suite consists of a set of test system configurations and the appropriate methods that suit the test context, e.g., available computational resources and testing time. For example, in in-service monitoring in which the device under test is working as designed, the tests are those that can be performed while the device under test is operating with a live, in-service input signal, the signal is the in-service input signal and the circuits that perform the test constitute part of the device under test. Additionally, in this mode of testing, the testing has to take account of the fact that the memory available for storing the phase signal and the computational resources available to process the phase signal are limited.

A comprehensive test suite identifies defects in the device under test in each test context by performing a specific test protocol designed to optimize detection of the defects in that test context.

In the characterization context, the testing verifies the functional and dynamic performance of the device design against simulated specifications, where a tolerance defines a test limit. This involves showing as close to an absolute value of the measurement as practically feasible. Since the measurement is derived from data that is not directly related to the measurement value being calculated, calibration may be required to evaluate the tolerance of the value. The goal of a characterization test is to show compliance with the performance specifications, to determine the effects of process variations and to predict whether performance will comply with the performance specifications during mass manufacturing. Characterization testing is usually performed in a bench environment where high-speed, low noise signals can be assured. The use of larger data sets extracted from the phase comparator is viable because measurement resolution and accuracy are paramount.

In the manufacturing test context, testing is performed to show that functional and dynamic performance metrics of each production device under test comply with the performance specification for the device design. Testing is usually optimized to show compliance of the device under test with the performance specification in a minimum test time and using minimal test resources to minimize the cost of testing. Certain embodiments of the invention use the parametric information obtained by processing the phase signal in many manufacturing test contexts. In accordance with embodiments of the invention, the phase signal extracted from the phase comparator may be processed to obtain parametric information that provides a performance metric for such performance characteristics as transmitter circuit random jitter+ deterministic jitter (rj+dj), transmitter circuit harmonic jitter (part of rj), proportional and integral loop constants for the phase tracking circuit in the receiver circuit, input offset of the receiver circuit, and equalization performance (i.e., dj suppression or reduction) of the receiver circuit. In other embodiments, additional parametric measurements such as in-band and out-of-band harmonic contamination, and hunting behavior are used. To address each potential manufacturing defect, test context and measurement hardware combine with architecture to access the required data that is analyzed using a DSP to quantify the manufacturing defect. An appropriate stimulus applied to the device under test, together with access to and processing of parametric information gives rise to a parametric measurement. In other words, the manufacturing test may require application of a stressing signal (either internally or externally sourced), together with the accessing and processing of hard-to-observe data.

In the calibration context, the test system is embodied as a self test (BIST) circuit built into the device under test. The parametric information generated by the test system is used to decide whether control parameters can be adjusted to optimize dynamic performance of the device under test. The test system can carry out the calibration operation just after initial reset of the device under test. The signal received by the device under test in this mode can be a special training pattern. Alternatively, calibration can be performed using an in-service signal. Calibration testing that can be performed using an in-service signal can be performed continuously during normal in-service operation of the device under test.

In the in-service monitoring context, the test system performs a non-invasive measurement that does not affect normal operation of the device under test. The parametric information (representing such properties as phase tracking error or a processed derivative) generated by the test system may need to be compressed or simply expressed as pass/fail data. The in-service monitoring context may comprise testing for deterioration of the properties of the I/O circuit of the device under test during in-service operation.

Certain embodiments of the invention are able to identify, for a device under test, defects in a given test context. In such embodiments, the parametric information derived from the phase signal is used to identify such defects in such test context.

EXAMPLES

Examples of specific tests for use in various ones of the above-described test contexts will be described next. The examples illustrate various embodiments of the invention.

The specific example disclosed can be changed and a like or similar result can be obtained.

Example 1

Test for Receiver Input Offset

As noted above, typical embodiments of receiver circuit 105 include a differential input circuit in which a non-zero input offset voltage can cause jitter due to a difference in the average phase between the rising and falling edges of the input signal.

Referring to FIG. 2A, 2B or 2C, to measure the input offset, test system 100 provides an ideal differential input signal having a known bit pattern to the input of the receiver circuit 105 as signal 109. Phase signal 123 generated by phase comparator 121 is fed to processing circuit 133. Processing circuit 133 records and analyzes the phase signal, as described above. In the analysis, the bits constituting the phase signal are matched with the corresponding transitions in the bit pattern of signal 109. The bits of each phase signal component (E or L) constituting phase signal 133 matched to the rising edges of the bit pattern are counted and the bits of each phase signal component matched to the falling edges of the bit pattern are counted. Additionally, the rising edges are counted to determine the number of rising edges and the falling edges are counted to determine the number of falling edges. A first probability of each phase signal component being received with a rising edge is calculated and a second probability of each phase signal component being received with a falling edge is calculated. Unequal probabilities indicate a non-zero input offset. Optionally, the input circuit of the receiver circuit can be adjusted to reduce the input offset to zero, as indicated by the probabilities being equal, or to reduce the input offset to an acceptably small amount, as indicated by the probabilities differing by less than a threshold value.

In the characterization mode, the relationship between the difference in the probabilities and the input offset for a given device design can be determined imposing known input offsets on signal 109 and measuring the resulting probability differences. The probability differences can then be correlated to the input offset. Then, in the manufacturing test mode, the processing circuit processes the phase signal in the manner described above to generate a probability difference as the parametric information. A probability difference less than a threshold value corresponding to the input offset voltage specification for the device design indicates that the input offset of the device under test complies with the input offset performance specification of the device design.

Example 2

Phase Tracking Circuit PLL Loop Equation

The test system embodiments described above can be used to measure phase-locked loop equation parameters from which it can be determined whether defects exist in the device under test. In this example, the loop equation is calibrated so that optimum performance is obtained over a variation in such parameters as voltage and temperature. Calibration compensates for expected variations in the manufacturing process. The remaining dynamic performance parameters can be compared to design specifications to accept or reject the part. The loop equation parameters are determined by monitoring the phase signal as the phase tracking circuit responds to an embodiment of signal 109 having a repetitive step in its phase or frequency. Alternatively, the embodiment of signal 109 may have a linear phase modulation.

In all test contexts, the signal just described is used as signal 109. The phase signal extracted from the phase comparator of the phase tracking circuit is correlated to harmonic information. In an example, the phase signal is recorded and processed externally, as in the embodiment shown in FIG. 2A. This imposes a high resource load on the externally-located processing circuit 133 as the data rate of phase signal 123 is very high. The example of test system 100 described above with reference to FIG. 2B can reduce the high data rate needed to send phase signal 123 off chip by locating processing circuit 133 within device under test 101. This results in a compromise in the nature of the result as the on-chip embodiment of processing circuit 133 is typically less capable than an off-chip embodiment. Alternatively, as described above with reference to FIG. 2C, part of processing circuit 133 may be internal to device under test 101 and the remainder of processing circuit 133 may be external to device under test 101. In an example, on-chip data reducer 151 performs a filtering operation to obtain the desired data reduction. The resulting data-reduced phase signal 155 is transferred to off-chip data analyzer 153 via data port 137, which in one example is a JTAG test access port.

In the calibration context, a test time longer than that available in the manufacturing test context is generally available. A longer test time allows a more complex phase and/or frequency modulation to be used for signal 109. This allows for a more comprehensive and/or accurate measurement result.

Example 3

Phase Tracking Circuit Tracking Characteristics
(Slew Limit)

A slew rate limit test performed on the phase tracking circuit is an extreme version of an in-band performance test. In the slew-rate limit test, signal 109 is configured to push the performance of the bang-bang phase tracking circuit to its control limits. Signal 109 is phase-modulated with a sinusoidal or triangular waveform sufficient in amplitude to cause the control loop of the phase tracking circuit to saturate. The control limit of the phase tracking circuit is detected by analyzing the phase signal to detect evidence of saturation provided by runs of phase-early states or phase-late states occurring where transitions are expected.

In the manufacturing test context, the slew-rate limit of the phase tracking circuit is typically tested using an embodiment of the test system in which processing circuit 133 is external to the device under test, as in the example of test system 100 described above with reference to FIG. 2A. Signal 109 is a pseudo-random bit sequence (PRBS) phase modulated with a sinusoidal or triangular waveform having an amplitude sufficient to cause the control loop of the PLL to saturate, as described above. Phase-early or phase-late states are filtered from the phase signal, using conventional digital signal processing or a digital state machine, to highlight the saturated regions. The resulting data is then auto correlated. A large ata set is used for this so that random noise can be averaged out of the analysis.

When the phase tracking circuit is properly tracking the input signal, the phase signal is random, but the modulation signal that forms part of signal 109 can be extracted from the result of the autocorrelation. When the phase tracking circuit saturates, the phase signal is no longer wholly random, but exhibits runs of the same state. Consequently, the result of the autocorrelation exhibits gaps in the modulation signal extracted from the result of the autocorrelation. As noted above, the phase signal can be transferred to processing circuit 133 external of the device under test. Alternatively, the embodiment of test system 100 described above with reference to FIG. 2C can be used. In this, the phase-early or phase-late states are filtered by on-chip data reducing circuit 151 and the results of the filtering are further processed by off-chip analyzer 153.

The form of signal 109 and test system 100 just described can also be used to test the in-band performance of the phase tracking circuit. In such a test, signal 109 has characteristics that are within the range of input signal characteristics the phase tracking circuit is specified to track, i.e., signal 109 is phase-modulated with the phase modulation having a sinusoidal or triangular waveform insufficient in amplitude to cause the control loop to saturate. Stochastic digital signal processing of phase signal 123 will result in showing whether the phase tracking circuit was capable of successfully tracking phase-modulated signal 109.

Example 4

Deterministic Jitter/Transfer Jitter

The term jitter refers to dynamic changes in the timing of transitions from their nominal timings. Jitter has distinct identifiable components. Deterministic jitter (dj) typically results from such causes as bandwidth limitations in the transmitter circuit, signal injection from other core clocks within the device under test or reflections in the transmission medium. A bandwidth limitation in the output of the transmitter circuit causes jitter when the signal changes most rapidly, such as when bits in opposite states are juxtaposed (for example, 1,0,1,0, . . .). The bit patterns that provide the most effective indication of deterministic jitter depend on the severity of the bandwidth limitation. Jitter that depends on the bit pattern is also known as inter-symbol interference (ISI).

Transfer jitter characterizes the extent to which jitter present at the input of the device under test is transferred to the output of the device under test. The transfer jitter performance of a device under test can be tested using test system 200 described above with reference to FIG. 5. The transmitter circuit of the device under test receives a PRBS as signal 209. The output signal 219 generated by the transmitter circuit is provided to external phase-tracking circuit 207 via high impedance buffer circuit 229. Alternatively, test system 300 described above with reference to FIG. 7 may be used, with the output signal 219 of the transmitter circuit fed via loop-back signal path 359 to the input of internal receiver circuit 105, where the phase signal is output by phase comparator 121. Prior to receiving output signal 219, external phase tracking circuit 207 or internal phase tracking circuit 107 are calibrated using a signal of known jitter. Processing circuit 233 or processing circuit 133 is used to analyze the respective phase signal 223 or 123 to measure the jitter of transmitter output signal 219. Transfer jitter is assessed using this jitter calculation and the jitter value of signal 219.

A test similar to that just described can be used to determine defects such as ISI and associated harmonics. The injection of harmonic signals into sensitive parts of the device under test results in jitter that has components that correlate with the injected signals. These signals are embedded in random phase noise, but DSP techniques can be used to extract the signal components.

Example 5

Receiver Equalizer

A receiver equalizer is an adjustable equalizer circuit that filters an input signal to reduce ISI caused by bandwidth limitations. An example of a receiver equalizer is shown at 563 in FIG. 10. When the receiver equalizer is optimally adjusted, the phase error, as represented by phase signal 123, is independent of the bit pattern and the rise and fall times of the input signal. Signal 209 provided to transmitter circuit 215 is typically a data signal. Phase signal 123 extracted from the phase comparator 121 of the phase tracking circuit 107 of receiver circuit 105 following receiver equalizer 563 is processed by processing circuit 133 to provide parametric information 135. Parametric information 135 is provided to equalizer controller 565 that generates equalizer control signal 568. Equalizer control signal 568 is fed to equalizer 563 to cause the equalizer to minimize jitter over the defined range of waveform degradation imposed on the output signal 219 of transmitter circuit by transmission medium 559 or a stress circuit (not shown) linking the output of transmitter circuit 215 to the input of equalizer 563. More information regarding this example can be found in the description of FIGS. 10-12 set forth above.

Example 6

Phase Tracking Circuit Harmonics On-Chip In-Band Random/Deterministic Jitter The phase signal can be processed to determine the spectral characteristics of jitter resulting from an interference signal injected into the phase tracking circuit from a source external to the phase tracking circuit. Such jitter has random and deterministic components. Deterministic jitter is caused by bandwidth limits in the transmission channel or by injected periodic signals.

This aspect of the device under test's performance can be tested using a test system having a loop-back signal internal or external to the device under test. Optionally, the loop-back signal path includes a stress circuit, as described above with reference to FIG. 9. In embodiments in which the loop-back signal path includes a transmission medium, equalization of the transmission medium may be required to prevent deterministic jitter caused by a bandwidth limitation in the transmission medium from obscuring the deterministic jitter caused by the bandwidth limitation of the transmitter circuit. In this test, processing circuit 133 subjects phase signal 123 to an average power spectral density (APSD) analysis to extract the spectral characteristics of the phase signal. Information relating to the jitter can be extracted from the spectral characteristics. Sources of deterministic jitter can be identified by correlating the spectral information extracted from the phase signal and spectral information relating to signals inside or outside the device under test. Random jitter manifests itself as a spectrum having no specific structure. Such a spectrum represents random noise. Software that configures a digital signal processor to perform such an analysis is commercially available.

This disclosure describes the invention in detail using illustrative embodiments but the invention defined by the appended claims is not limited to the precise embodiments described.

We claim:

1. A method of using a phase comparator to test an input/output (I/O) circuit of a device under test, the method comprising:
   receiving a signal at the device under test;
   in the phase comparator, generating a phase signal in response to the signal;
   feeding the phase signal from the phase comparator to a loop filter;
   extracting the phase signal from the phase comparator prior to the loop filter; and
   determining parametric information pertaining to the I/O circuit of the device under test from the phase signal extracted from the phase comparator prior to the loop filter.

2. The method of claim 1, in which:
   the I/O circuit comprises the phase comparator; and
   the determining is performed internally to the device under test.

3. The method of claim 2, in which:
   the device under test additionally comprises a test access port; and
   the method additionally comprises outputting the parametric information via the test access port.

4. The method of claim 1, in which the determining is performed externally of the device under test.

5. The method of claim 4, in which:
   the I/O circuit comprises the phase comparator;
   the device under test additionally comprises a test access port; and
   the method additionally comprises outputting the phase signal via the test access port.

6. The method of claim 5, additionally comprising subjecting the phase signal to data reduction prior to the outputting.

7. The method of claim 1, in which:
   the I/O circuit comprises a receiver circuit, the receiver circuit comprising the phase comparator and having an input coupled to the phase comparator;
   the method additionally comprises:
      providing a transmitter circuit having an input and an output, and
      coupling the output of the transmitter circuit to the input of the receiver circuit; and
   the receiving comprises receiving the signal at the input of the transmitter circuit.

8. The method of claim 6, in which the I/O circuit additionally comprises the transmitter circuit.

9. The method of claim 1, in which:
   the I/O circuit comprises a transmitter circuit having an input and an output;
   the method additionally comprises:
      providing a phase comparator external to the device under test, and
      coupling the output of the transmitter circuit to the input of the phase comparator; and
   the receiving comprises receiving the signal at the input of the transmitter circuit.

10. The method of claim 1, additionally comprising subjecting the phase signal to data reduction prior to the determining.

11. The method of claim 10, in which the data reduction comprises one of filtering and compressing.

12. The method of claim 1, in which the determining comprises determining one of transmitter random jitter (rj), transmitter deterministic jitter (dj) and transmitter harmonic jitter as the parametric information.

13. The method of claim 1, in which the determining comprises determining one of receiver clock and data recovery proportional and integral loop constants, receiver input offset, receiver functional failure, receiver parametric failure, receiver equalization performance in-band harmonic frequency contamination, out-of-band harmonic frequency contamination and loop phase hunting behavior as the parametric information.

14. The method of claim 1, in which:
   the receiving comprises receiving the signal at the I/O circuit;
   the I/O circuit comprises the phase comparator; and
   the parametric information represents deviations between transition timings of the phase signal and nominal transition timings.

15. The method of claim 14, in which the signal has a known transition timing accuracy.

16. The method of claim 1, in which the parametric information additionally comprises average power spectral density.

17. The method of claim 1, in which the receiving comprises receiving a pseudo-random bit sequence as the signal.

18. The method of claim 1, in which the receiving comprises:
   providing a bit sequence; and
   periodically offsetting the bit sequence in phase by non-integer unit intervals to generate the signal.

19. The method of claim 1, in which the receiving comprises:
   providing a bit sequence; and
   sinusoidally modulating the bit sequence in phase to generate the signal.

20. The method of claim 1, in which the receiving comprises:
   providing an input signal; and
   subjecting the input signal to waveform degradation to provide the signal.

21. The method of claim 1, in which the receiving comprises:
   providing an input signal;
   pre-emphasizing the input signal to provide a pre-emphasized input signal;
   transmitting the pre-emphasized input signal to the device under test via a transmission medium, the transmitting subjecting the pre-emphasized input signal to waveform degradation; and
   calibrating the pre-emphasizing to compensate for the waveform degradation.

22. The method of claim 21, in which:
   the transmitting comprises transmitting the pre-emphasized input signal through the transmission medium from a proximal end of to a distal end;
   the pre-emphasizing applies a first pre-emphasis; and
   the calibrating comprises:
      terminating the distal end of the transmission medium with a reflecting termination,
      at the proximal end of the transmission medium, subtracting the pre-emphasized input signal from a superposition of a de-emphasized reflected signal and the pre-emphasized input signal to obtain the de-emphasized reflected signal, the de-emphasized reflected signal resulting from reflection of the pre-emphasized input signal at the termination;
      equalizing the de-emphasized reflected signal with a second equalization to obtain a reflected signal, the second equalization equal to the first equalization; and adjusting the first equalization and the second equalization until the reflected signal matches the input signal.

23. The method of claim 1, in which the extracting comprises converting a linear phase signal to a digital phase signal.

24. A test system for testing a device under test comprising an input/output (I/O) circuit, the test system comprising:
a phase tracking circuit comprising a phase comparator and a loop filter, the phase comparator operable to generate a phase signal and to feed the phase signal to the loop filter; and
a processing circuit connected to receive from the phase comparator prior to the loop filter the phase signal generated by the phase comparator, the processing circuit operable to determine parametric information pertaining to the I/O circuit from the phase signal received from the phase comparator prior to the loop filter.

25. The test system of claim 24, in which the processing circuit is external to the device under test.

26. The test system of claim 24, in which:
the I/O circuit comprises a receiver circuit; and
the phase tracking circuit constitutes part of the receiver circuit.

27. The test system of claim 26, in which the processing circuit is internal to the device under test.

28. The test system of claim 26, in which:
the processing circuit is external to the device under test; and
the test system additionally comprises a connection between the phase comparator and the processing circuit.

29. The test system of claim 26, in which the processing circuit comprises a data reduction circuit internal to the device under test and an analyzer external to the device under test.

30. The test system of claim 29, additionally comprising a communication link between the data reduction circuit and the analyzer.

31. The test system of claim 26, in which:
the receiver circuit comprises an input; and
the test system additionally comprises a stress circuit preceding the input of the receiver circuit.

32. The test system of claim 26, in which:
one of the I/O circuit and the test system comprises a transmitter circuit having an output; and
the phase tracking circuit has an input coupled to the output of the transmitter circuit.

33. The test system of claim 32, in which the I/O circuit comprises the transmitter circuit.

34. The test system of claim 32, in which the transmitter circuit is external to the device under test.

35. The test system of claim 32, additionally comprising a stress circuit between the output of the transmitter circuit and the input of the receiver circuit.

36. The test system of claim 35, additionally comprising an additional phase tracking circuit between the output of the transmitter circuit and the input of the stress circuit.

37. The test system of claim 36, in which:
the I/O circuit comprises the transmitter circuit;
the additional phase tracking circuit comprises an additional phase comparator, the additional phase comparator generating an additional phase signal; and
the processing circuit is additionally connected to receive the additional phase signal and is additionally operable to determine additional parametric information pertaining to the I/O circuit from the additional phase signal.

38. The test system of claim 24, in which:
the I/O circuit comprises a receiver circuit and a receiver equalizer connected in tandem with the receiver circuit;
the parametric information pertains to the receiver equalizer; and
the test system additionally comprises an equalizer controller connected to receive the parametric information and operable in response thereto to provide an equalizer control signal to the receiver equalizer.

39. An integrated circuit comprising the test system of claim 24.

40. An electronic device, comprising:
an input/output circuit comprising a phase tracking circuit, the phase tracking circuit comprising a phase comparator and a loop filter, the phase comparator operable to generate a phase signal and to feed the phase signal to the loop filter; and
a signal path extending from the phase comparator prior to the loop filter to convey the phase signal to a location external to the phase tracking circuit.

41. The electronic device of claim 40, in which the signal path extends to a location external to the input/output circuit.

42. The electronic device of claim 40, in which the phase signal comprises an early phase signal component and a late phase signal component.

* * * * *

UNITED STATES PATENT AND TRADEMARK OFFICE
CERTIFICATE OF CORRECTION

| | | |
|---|---|---|
| PATENT NO. | : 7,571,363 B2 | Page 1 of 1 |
| APPLICATION NO. | : 11/419003 | |
| DATED | : August 4, 2009 | |
| INVENTOR(S) | : Hugh S. Wallace et al. | |

It is certified that error appears in the above-identified patent and that said Letters Patent is hereby corrected as shown below:

In column 29, line 46, in Claim 8, delete "claim 6," and insert -- claim 7, --, therefor.

Signed and Sealed this

Twenty-second Day of September, 2009

David J. Kappos
*Director of the United States Patent and Trademark Office*